United States Patent
Kayaba et al.

(10) Patent No.: US 12,261,143 B2
(45) Date of Patent: Mar. 25, 2025

(54) METHOD OF MANUFACTURING SUBSTRATE LAYERED BODY AND LAYERED BODY

(71) Applicant: MITSUI CHEMICALS, INC., Tokyo (JP)

(72) Inventors: Yasuhisa Kayaba, Urayasu (JP); Jun Kamada, Narashino (JP); Yuzo Nakamura, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 687 days.

(21) Appl. No.: 17/284,833

(22) PCT Filed: Oct. 17, 2019

(86) PCT No.: PCT/JP2019/040845
§ 371 (c)(1),
(2) Date: Apr. 13, 2021

(87) PCT Pub. No.: WO2020/085183
PCT Pub. Date: Apr. 30, 2020

(65) Prior Publication Data
US 2021/0391292 A1    Dec. 16, 2021

(30) Foreign Application Priority Data

Oct. 26, 2018  (JP) ................................ 2018-202212
May 30, 2019  (JP) ................................ 2019-101252

(51) Int. Cl.
H01L 23/00  (2006.01)

(52) U.S. Cl.
CPC ............. *H01L 24/27* (2013.01); *H01L 24/05* (2013.01); *H01L 24/08* (2013.01); *H01L 24/32* (2013.01);
(Continued)

(58) Field of Classification Search
CPC ......... H01L 24/27; H01L 24/05; H01L 24/08; H01L 24/32; H01L 24/83;
(Continued)

(56) References Cited

U.S. PATENT DOCUMENTS

| | | |
|---|---|---|
| 6,524,701 B1 | 2/2003 | Kondo et al. |
| 2010/0244201 A1 | 9/2010 | Kitada |
| 2018/0286829 A1 | 10/2018 | Akaike et al. |

FOREIGN PATENT DOCUMENTS

| | | |
|---|---|---|
| CN | 1254743 A | 5/2000 |
| JP | H04132258 A | 5/1992 |

(Continued)

OTHER PUBLICATIONS

Leimhofer et al., "Green one-pot synthesis and processing of polyimide-silica hybrid materials", Journal of Materials Chemistry A, (May 19, 2017), vol. 5, pp. 16326-16335. (Cited in Extended European Search Report issued on Jun. 2, 2022, in corresponding European Patent Application No. 19876881.4).
(Continued)

*Primary Examiner* — Daniel H Lee
(74) *Attorney, Agent, or Firm* — BUCHANAN INGERSOLL & ROONEY PC

(57) ABSTRACT

A method of manufacturing a substrate layered body includes: a step of applying a bonding material to the surface of at least one of a first substrate or a second substrate; a step of curing the bonding material applied on the surface to form a bonding layer having a reduced modulus at 23° C. of 10 GPa or less; and a step of bonding the first substrate and the second substrate via the bonding layer formed.

14 Claims, 4 Drawing Sheets

(52) U.S. Cl.
CPC .... *H01L 24/83* (2013.01); *H01L 2224/05147* (2013.01); *H01L 2224/08145* (2013.01); *H01L 2224/27015* (2013.01); *H01L 2224/27515* (2013.01); *H01L 2224/32145* (2013.01); *H01L 2224/80895* (2013.01); *H01L 2224/80896* (2013.01); *H01L 2224/83203* (2013.01); *H01L 2924/0695* (2013.01); *H01L 2924/07025* (2013.01); *H01L 2924/0715* (2013.01)

(58) Field of Classification Search
CPC . H01L 2224/05147; H01L 2224/08145; H01L 2224/27015; H01L 2224/27515; H01L 2224/32145; H01L 2224/80895; H01L 2224/80896; H01L 2224/83203; H01L 2924/0695; H01L 2924/07025; H01L 2924/0715; H01L 24/16; H01L 24/81; H01L 23/544; H01L 24/03; H01L 24/29; H01L 25/0655; H01L 25/18; H01L 33/0093; H01L 2223/5442; H01L 2223/54426; H01L 2223/54473; H01L 2224/1181; H01L 2224/1184; H01L 2224/11845; H01L 2224/13147; H01L 2224/16145; H01L 2224/27416; H01L 2224/2784; H01L 2224/27848; H01L 2224/2919; H01L 2224/29191; H01L 2224/73104; H01L 2224/8113; H01L 2224/81132; H01L 2224/81193; H01L 2224/81203; H01L 2224/83048; H01L 2224/8313; H01L 2224/83132; H01L 2224/83193; H01L 2224/8485; H01L 2224/84895; H01L 2224/94; H01L 2924/12041; H01L 2924/1434; H01L 2924/1461; H01L 2933/0016; H01L 24/06; H01L 21/02; H01L 24/94; H01L 2224/03515; H01L 2224/065; B32B 2250/02; B32B 2255/20; B32B 2255/24; B32B 2255/28; B32B 2457/08; B32B 2457/14; B32B 7/12; B32B 9/04; C09J 2203/326; C09J 2483/00; C09J 5/06; C09J 5/02; C09J 201/00; C09J 2301/312
See application file for complete search history.

(56) References Cited

FOREIGN PATENT DOCUMENTS

| JP | 2010226060 A | | 10/2010 |
|---|---|---|---|
| JP | 2013105803 A | * | 5/2013 |
| JP | 2016047895 A | | 4/2016 |
| JP | 2017082195 A | | 5/2017 |
| WO | 2016/103528 A1 | | 6/2016 |

OTHER PUBLICATIONS

Andrey Bayrashev et al., "Silicon wafer bonding through RF dielectric heating", Sensors and Actuators A, 2003, vol. 103, pp. 16-22, Elsevier Science B.V., 0924-42447/03/$, PII:S0924-4247(02)00327-8. (7 pages).

International Search Report (PCT/ISA/210) with an English translation, and Written Opinion (PCT/ISA/237) mailed on Dec. 17, 2019, by the Japanese Patent Office as the International Searching Authority for International Application No. PCT/JP2019/040845. (7 pages).

J.J. McMahon et al., "Bonding Interfaces in Wafer-Level Metal/Adhesive Bonded 3D Integration", Electronic Components and Technology Conference, Jun. 2008, pp. 871-878, 978-1-4244-2231-9/08/$25.00, IEEE, Rensselaer Polytechnic Institute, Troy, NY, USA. (9 pages).

Qin-Yi Tong et al., "Wafer Bonding and Layer Splitting for Microsystems", Advanced Materials, 1999, vol. 11, No. 17, pp. 1409-1425, 0935-9648/99/1712-1409, Wiley-VCH Verlag GmbH, Weinheim, Germany. (17 pages).

Zhen Song et al., "Void-free BCB adhesive wafer bonding with high alignment accuracy", Microsystem Technology, 2015, vol. 21, pp. 1633-1641, DOI 10.1007/s00542-014-2242-4, Springer-Verlag Berlin Heidelberg. (9 pages).

* cited by examiner

METHOD OF MANUFACTURING SUBSTRATE LAYERED BODY AND LAYERED BODY

TECHNICAL FIELD

The present invention relates to a method of manufacturing a substrate layered body and a layered body.

BACKGROUND ART

As electronic devices become smaller and lighter and have higher performance, higher integration of semiconductor chips and the like is demanded. However, it is difficult to fully meet these demands by miniaturizing circuits. In view of this, in recent years, a method of achieving high integration by vertically layering a plurality of semiconductor substrates (wafers), semiconductor chips, or the like to form a multilayered three-dimensional structure has been proposed. Examples of methods for layering semiconductor substrates (wafers), semiconductor chips, and the like (hereinafter, sometimes referred to as "semiconductor substrates and the like") include direct bonding of the substrates to each other and use of adhesives (see, for example, Patent Documents 1 to 3 and Non Patent Documents 1 to 4).

[Patent Document 1] Japanese Patent Application Laid-Open (JP-A) No. H04-132258

[Patent Document 2] JP-A No. 2010-226060

[Patent Document 3] JP-A No. 2016-47895

[Non Patent Document 1] A. Bayrashev, B. Ziaie, Sensors and Actuators A 103 (2003) 16-22.

[Non Patent Document 2] Q. Y. Tong, U. M. Gosele, Advanced Material 11, No. 17 (1999) 1409-1425.

[Non Patent Document 3] Z. Song, Z. Tan, L. Liu, Z. Wang, Microsystem Technology, 21 (2015) 1633-1641.

[Non Patent Document 4] J. J. McMahon, E. Chan, S. H. Lee, R. J. Gutmann, and J.-Q. Lu, Proceedings—Electronic Components and Technology Conference•June 2008 871-878

SUMMARY OF INVENTION

Technical Problem

In direct bonding, there is a problem that voids are more likely to occur due to microbumps, particles, and the like due to wiring and the like on the surface of substrates.

On the other hand, in the case of bonding with an adhesive, the adhesive is applied to the surface of a substrate, and then allowed to dry to become semi-cured, and then substrates are bonded together. At this time, there is a problem that substrate bonding displacement (misalignment) tends to occur.

One embodiment of the invention has been made in view of the above-described problem, and an object of the invention is to provide a method of manufacturing a substrate layered body and a layered body capable of producing a substrate layered body in which void generation and misalignment are suppressed.

Solution to Problem

Specific means for solving the above-described problems are as follows

<1> A method of manufacturing a substrate layered body, the method comprising:
 a step of applying a bonding material to a surface of at least one of a first substrate or a second substrate;
 a step of curing the bonding material applied to the surface, to form a bonding layer having a reduced modulus at 23° C. of 10 GPa or less; and
 a step of bonding the first substrate with the second substrate via the bonding layer.

<2> The method of manufacturing a substrate layered body according to <1>, wherein, in the step of forming the bonding layer, the bonding material applied to the surface is heated at from 100° C. to 450° C. for curing.

<3> The method of manufacturing a substrate layered body according to <1> or <2>, wherein, in the step of bonding the first substrate with the second substrate, the first substrate and the second substrate are bonded by heating the bonding layer at from 100° C. to 450° C., in a state in which the first substrate and the second substrate are in contact with each other via the bonding layer.

<4> The method of manufacturing a substrate layered body according to any one of <1> to <3>, wherein a degree of curing of the bonding layer after the step of forming the bonding layer and before the step of bonding the first substrate with the second substrate is 70% or more.

<5> The method of manufacturing a substrate layered body according to any one of <1> to <4>, wherein the bonding layer includes a silanol group on a surface thereof.

<6> The method of manufacturing a substrate layered body according to any one of <1> to <5>, wherein the bonding layer includes a siloxane bond, and at least one of an amide bond or an imide bond.

<7> The method of manufacturing a substrate layered body according to any one of <1> to <6>, the method further comprising a step of forming a hydroxyl group by performing a surface treatment on a surface of at least one of the first substrate or the second substrate at a side at which the substrate is in contact with the bonding layer.

<8> The method of manufacturing a substrate layered body according to any one of <1> to <7>, wherein a thickness of the bonding layer in the substrate layered body is from 0.001 μm to 8.0 μm.

<9> The method of manufacturing a substrate layered body according to any one of <1> to <8>, wherein, in the substrate layered body, a surface energy of a bonding interface between the first substrate and the second substrate is 2 J/m$^2$ or more.

<10> The method of manufacturing a substrate layered body according to any one of <1> to <9>, the method further comprising a step of temporarily fixing the first substrate and the second substrate via the bonding layer after the step of forming the bonding layer, wherein the surface energy of the bonding interface between the first substrate and the second substrate after the step of temporary fixing is 0.05 J/m$^2$ or more.

<11> A method of manufacturing a substrate layered body according to any one of <1> to <10>, the method further comprising a step of forming an electrode on the surface of the at least one of the first substrate or the second substrate to which the bonding material is applied, before the step of applying the bonding material.

<12> The method of manufacturing a substrate layered body according to <11>, the method further comprising a step of removing the bonding material from the electrode after the step of applying the bonding material and before the step of forming the bonding layer.

<13> The method of manufacturing a substrate layered body according to <11>, the method further comprising a step of removing the bonding layer from the electrode after the step of forming the bonding layer and before the step of bonding the first substrate and the second substrate.

<14> The method of manufacturing a substrate layered body according to any one of <1> to <13>, the method further comprising a step of forming an electrode on the surface on which the bonding layer has been formed after the step of forming the bonding layer and before the step of bonding the first substrate and the second substrate.

<15> A layered body comprising:
a first substrate; and
a bonding layer formed on the first substrate, wherein:
the bonding layer is formed by curing a bonding material, and the reduced modulus at 23° C. is 10 GPa or less.

Advantageous Effects of Invention

One aspect of the invention can provide a method of manufacturing a substrate layered body, which can produce a substrate layered body in which void generation and misalignment are suppressed, and a layered body.

DESCRIPTION OF EMBODIMENTS

Figure 1A:
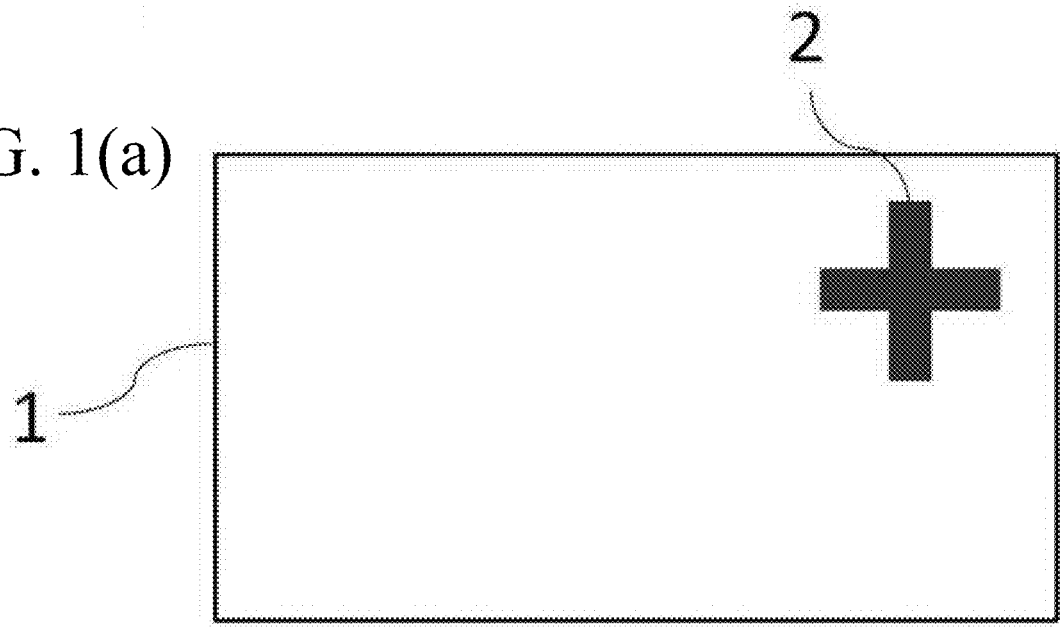
FIG. 1 is a schematic diagram illustrating alignment marks formed on a first substrate and a second substrate in Example 2.

Herein, numerical ranges indicated using "to" mean a range including the numerical values described before and after "to" as the lower limit value and the upper limit value, respectively.

With regard to the stepwise numerical ranges described herein, the upper limit value or the lower limit value described in one numerical range may be replaced with the upper limit value or the lower limit value of another stepwise numerical range. In the numerical ranges described herein, upper limit values or lower limit values of the numerical value ranges may be replaced with values described in Examples.

As used herein, "substrate layered body" means a layered body having a structure in which two substrates are bonded together via a bonding layer formed by the method of manufacturing a substrate layered body in the present disclosure. The substrate layered body may include three or more substrates, and two of the three or more substrates may have a structure in which the two substrates are bonded via a bonding layer formed by the method of manufacturing a substrate layered body in the present disclosure.

[Method of Manufacturing Substrate Layered Body]

The method of manufacturing a substrate layered body in the present disclosure includes: a step (hereinafter also referred to as "first step") of applying a bonding material to the surface of at least one of a first substrate or a second substrate; a step (hereinafter also referred to as "second step") of curing the bonding material applied on the surface to form a bonding layer having a reduced modulus at 23° C. of 10 GPa or less; and a step (hereinafter also referred to as "third step") of bonding the first substrate and the second substrate via the bonding layer formed.

The reduced modulus at 23° C. can be measured by the method described in Examples below.

In the method of manufacturing a substrate layered body in the present disclosure, a first substrate and a second substrate are bonded via a bonding layer in which a bonding material is cured and the reduced modulus at 23° C. is 10 GPa or less. In other words, the first substrate and the second substrate are bonded by a bonding layer in which a bonding material is not in a semi-cured state but in a cured state and the reduced modulus at 23° C. is at or below a predetermined value. Due to the bonding of the first substrate and the second substrate via the cured bonding layer, displacement (misalignment) of substrate bonding is less likely to occur. Furthermore, by bonding the first substrate and the second substrate via the bonding layer, which has a reduced modulus at 23° C. of 10 GPa or less, gaps are absorbed by the bonding layer and void formation is suppressed.

<Step of Applying Bonding Material (First Step)>

The method of manufacturing a substrate layered body in the present disclosure includes a step of applying a bonding material to the surface of at least one of a first substrate or a second substrate.

(First Substrate and Second Substrate)

The materials of the first substrate and the second substrate are not particularly limited and may be those usually used. The materials of the first substrate and the second substrate may be the same or different from each other.

The first substrate and the second substrate preferably contain at least one element selected from the group consisting of Si, Al, Ti, Zr, Hf, Fe, Ni, Cu, Ag, Au, Ga, Ge, Sn, Pd, As, Pt, Mg, In, Ta, and Nb. Examples of the material of the first substrate and the second substrate include a semiconductor: Si, InP, GaN, GaAs, InGaAs, InGaAlAs, InGaAlAs, SiC, an oxide, a carbide, a nitride: borosilicate glass (Pyrex (registered trademark)), quartz glass ($SiO_2$), sapphire, $ZrO_2$, $Si_3N_4$, AlN, a piezoelectric material, a dielectric: $BaTiO_3$, $LiNbO_3$, $SrTiO_3$, or diamond, and a metal: Al, Ti, Fe, Cu, Ag, Au, Pt, Pd, Ta, or Nb.

The material of the first substrate and the second substrate may be another resin: polydimethylsiloxane (PDMS), an epoxy resin, a phenolic resin, a polyimide, a benzocyclobutene resin, or a polybenzoxazole.

The first substrate and the second substrate may have a multi-layered structure. Examples of the multi-layered structure include a structure in which an inorganic layer such as silicon oxide, silicon nitride, or SiCN (silicon nitride) is formed on the surface of a silicon substrate or the like, a structure in which an organic layer such as a polyimide resin, a polybenzoxazole resin, an epoxy resin, or a cyclotene (Dow, Chem) is formed on the surface of a silicon substrate or the like, and a structure in which a composite of an inorganic substance and an organic substance is formed on a silicon substrate.

Each material is mainly used for the following applications.

Si is mainly used for semiconductor memory, LSI layering, CMOS image sensors, MEMS encapsulation, optical devices, or LEDs;

$SiO_2$ is mainly used for semiconductor memory, LSI layering, MEMS encapsulation, microfluidics, CMOS image sensors, optical devices, or LEDs;

PDMS is mainly used for microfluidics;

InGaAlAs, InGaAs, and InP are mainly used for optical devices; and

InGaAlAs, GaAs, and GaN are mainly used for LEDs.

<Step of Forming Electrode 1>

At least one of the first substrate or the second substrate may include an electrode on the surface on which a bonding material is applied. For example, the method of manufacturing a substrate layered body in the present disclosure may further include, prior to a step of applying a bonding material, a step of forming an electrode on a surface of at least one of the first substrate or the second substrate on which the bonding material is to be applied.

An electrode may be formed in a convex shape on the surface of the first substrate or the second substrate, may be formed through the first substrate or the second substrate, or may be formed embedded in the first substrate or the second substrate.

When the surface to which a bonding material is to be applied includes an electrode, and when a bonding material is further applied to the surface of a substrate with the electrode, the electrode is preferably formed in a convex shape on the surface of the substrate. When an electrode is included on the surface of a substrate, but a bonding material is not applied to the surface of the substrate with the electrode, the electrode on the surface of the substrate may be of any shape.

<Step of Forming Electrode 2>

After a bonding layer is formed on at least one of the first substrate or the second substrate, an electrode may be formed on the surface on which the bonding layer is formed. For example, a hole where an electrode is to be formed may be formed on a bonding layer by dry etching, and an electrode may be formed on the formed hole.

<Step of Forming Electrode 3>

When a bonding material is photosensitive, after a step of forming by photolithography a hole where an electrode is to be formed in the bonding material applied to at least one of the first substrate or the second substrate, and curing the bonding material to form a bonding layer, an electrode may be formed in the formed hole.

Examples of electrode materials include copper, solder, tin, gold, silver, and aluminum.

In the above-described steps 1 to 3 of forming an electrode, examples of methods of forming an electrode include electroplating, electroless plating, sputtering, and ink-jetting.

The thickness of the first substrate and the second substrate are each independently preferably from 0.5 μm to 1 mm, more preferably from 1 μm to 900 μm, and still more preferably from 2 μm to 900 μm.

The shape of the first substrate and the second substrate is also not particularly restricted. For example, when the first substrate and the second substrate are made of silicon, the silicon substrate may be a silicon substrate with an interlayer insulation layer (low-k film), and the silicon substrate may include a fine groove (recess), a fine through hole, or the like.

The surface roughnesses (Ra) of the first substrate and the second substrate are each independently preferably 1.2 nm or less, and from the viewpoint of facilitating temporary fixing at low temperatures as described below when bonding the first substrate and the second substrate, when a bonding material is applied to only one of the substrates and no bonding material is applied to the other, the surface roughness (Ra) of the substrate on which no bonding material is applied is preferably 1.2 nm or less.

The surface roughness of a substrate can be evaluated by morphological observation using a scanning probe microscope (SPM). Specifically, the surface roughness is determined by measuring a 3 μm×3 μm square area with an SPM SPA400 (manufactured by Hitachi High-Tech Corporation) in dynamic force microscope mode.

The water droplet contact angle of the surface of the first substrate and the second substrate are each independently preferably 90° or less, and from the viewpoint of facilitating temporary fixing at low temperatures as described below when bonding the first substrate and the second substrate, when a bonding material is applied to only one of the substrates and no bonding material is applied to the other, the water droplet contact angle of the surface of the substrate on which no bonding material is applied is preferably 90° or less.

The water droplet contact angle is specifically determined by measuring the static contact angle of water using a solid-liquid interface analysis system (DropMaster 500 image processing formula, manufactured by Kyowa Interface Science Co., Ltd.) at 23° C. and 50% humidity.

(Bonding Material)

The bonding material is not restricted as long as the bonding material is capable of forming a bonding layer with a reduced modulus at 23° C. of 10 GPa or less by curing. Examples of the bonding material include: a material in which a bond or a structure such as polyimide, polyamide, polyamide-imide, parylene, polyarylene ether, tetrahydronaphthalene, or octahydroanthracene is formed by crosslinking; a material in which a nitrogen ring-containing structure such as polybenzoxazar or polybenzoxazine is formed; a material in which a bond or a structure such as Si—O is formed by crosslinking; and an organic material such as a siloxane modified compound. The organic material may contain an aromatic ring structure. Examples of the bonding material include a polymerizable compound that can be polymerized singly or copolymerized, and a combination of such a polymerizable compound and a crosslinking agent. The bonding material may be a photosensitive material.

Examples of a structure with a Si—O bond (siloxane bond) include a structure represented by the following Formulas (1) to (3).

(1)

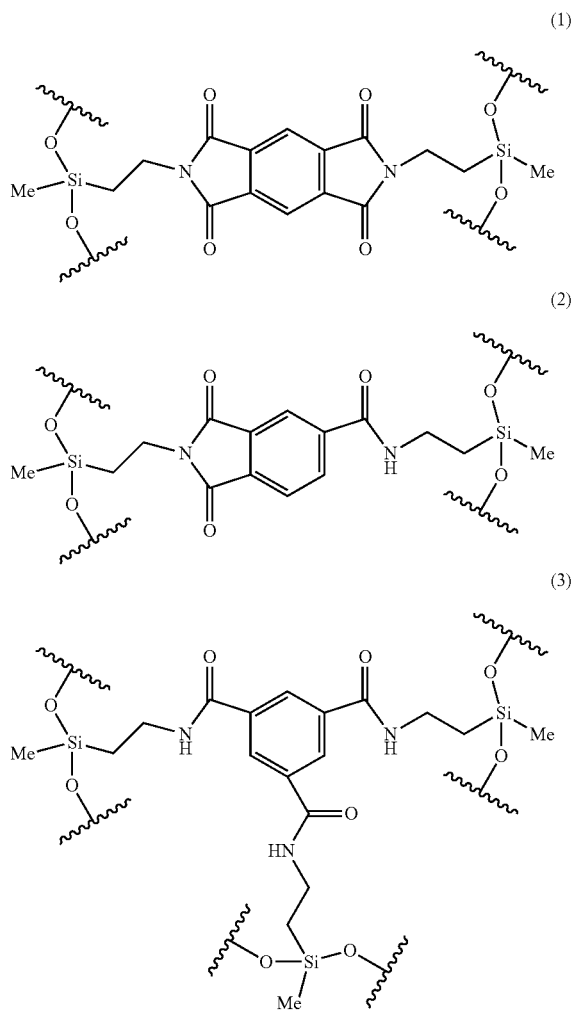

(2)

(3)

In a structure with a Si—O bond (siloxane bond), a group bound to Si may be substituted with an alkylene group, a phenylene group, or the like. For example, the structure may include $(-O-)_x(R_1)_y Si-(R^2)-Si(R_1)_y(-O-)_x$, or the like ($R_1$ represents a methyl group, or the like, and $R^2$ represents an alkylene group, a phenylene group, or the like. x and y are each independently an integer of 0 or greater, and x+y is 3).

Examples of a material in which a Si—O bond is formed by crosslinking include compounds represented by the following Formula (4) and Formula (5). The structures represented by Formula (1) and Formula (2) can be formed, for example, by heating and reacting compounds represented by Formula (4) and Formula (5), respectively.

(4)

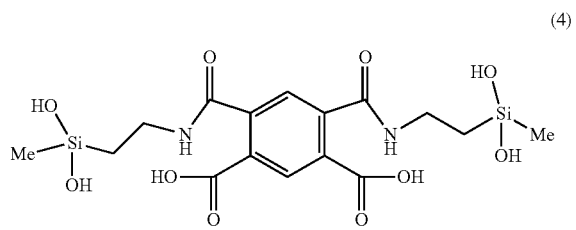

(5)

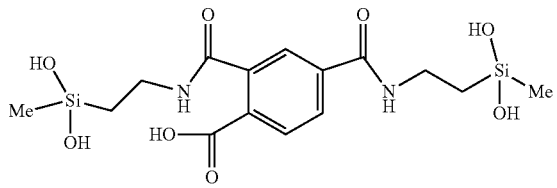

For example, when a bonding material includes a material in which a bond or a structure such as polyimide, polyamide, or polyamide-imide is formed by crosslinking, the bonding material preferably contains: a compound (A) including a cationic functional group containing at least one of a primary nitrogen atom or a secondary nitrogen atom, and having a weight average molecular weight of from 90 to 400,000; and a crosslinking agent (B) in which three or more —C(=O)OX groups (X is a hydrogen atom or an alkyl group having from 1 to 6 carbon atoms) are included in the molecule, one to six of the three or more —C(=O)OX groups are —C(=O)OH groups, and the weight average molecular weight is from 200 to 600.

(Compound (A))

A compound (A) is a compound which is a cationic functional group containing at least one of a primary nitrogen atom or a secondary nitrogen atom and having a weight average molecular weight of from 90 to 400,000. The cationic functional group is not particularly limited as long as the group is a functional group which can be positively charged and contains at least one of a primary nitrogen atom or a secondary nitrogen atom.

In addition to the primary nitrogen atom and the secondary nitrogen atom, the compound (A) may contain a tertiary nitrogen atom.

Herein, a "primary nitrogen atom" refers to a nitrogen atom (for example, a nitrogen atom contained in a primary amino group (—NH₂ group)) bonded only to two hydrogen atoms and one atom other than a hydrogen atom, or a nitrogen atom (cation) bonded to only three hydrogen atoms and one atom other than a hydrogen atom.

A "secondary nitrogen atom" refers to a nitrogen atom (in other words, a nitrogen atom contained in a functional group represented by the following Formula (a)) bonded only to one hydrogen atom and two atoms other than a hydrogen atom, or a nitrogen atom (cation) bonded only to two hydrogen atoms and two atoms other than a hydrogen atom.

A "tertiary nitrogen atom" refers to a nitrogen atom bonded only to three atoms other than a hydrogen atom (in other words, a nitrogen atom which is a functional group represented by the following Formula (b)) or a nitrogen atom (cation) bonded only to one hydrogen atom and three atoms other than a hydrogen atom.

(a)

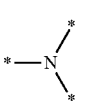

(b)

In Formulae (a) and (b), * represents a bonding position with an atom other than a hydrogen atom.

Here, the functional group represented by Formula (a) may be a functional group constituting a part of a secondary amino group (—NHR$^a$ group; wherein Ra represents an alkyl group), or may be a divalent linking group contained in the skeleton of the polymer.

The functional group represented by Formula (b) (in other words, a tertiary nitrogen atom) may be a functional group constituting a part of a tertiary amino group (—NR$^b$R$^c$ group; wherein R$^b$ and R$^c$ each independently represent an alkyl group) or may be a trivalent linking group contained in the skeleton of the polymer.

The weight average molecular weight of the compound (A) is from 90 to 400,000. Examples of the compound (A) include aliphatic amines, compounds having a siloxane bond (Si—O bond) and an amino group, amine compounds that do not have a Si—O bond and have a ring structure in the molecule. When which the compound (A) is an aliphatic amine, the weight average molecular weight thereof is preferably from 130 to 10000, more preferably from 130 to 5000, and still more preferably from 130 to 2000. When which the compound (A) is an amine compound that does not have a Si—O bond and has a ring structure in the molecule, the weight average molecular weight thereof is preferably from 90 to 600.

Herein, a weight average molecular weight refers to a weight average molecular weight in terms of polyethylene glycol measured by a gel permeation chromatography (GPC) method.

Specifically, the weight average molecular weight is calculated by an analysis software (Empower3 manufactured by Waters Corporation) using an aqueous solution having a sodium nitrate concentration of 0.1 mol/L as a developing solvent, using an analyzer Shodex DET RI-101 and two analytical columns (TSKgel G6000PWXL-CP and TSKgel G3000PWXL-CP manufactured by Tosoh Corporation) at a flow rate of 1.0 mL/min, and using polyethylene glycol/polyethylene oxide as a standard product.

The compound (A) may further contain an anionic functional group, a nonionic functional group, or the like, if necessary.

The nonionic functional group may be a hydrogen bond receptor or a hydrogen bond doner. Examples of the nonionic functional group include a hydroxy group, a carbonyl group, and an ether group (—O—).

The anionic functional group is not particularly limited as long as the group is a functional group capable of being negatively charged. Examples of the anionic functional group include a carboxylic acid group, a sulfonic acid group, and a sulfuric acid group.

Examples of the compound (A) include an aliphatic amine, and more specific examples of the compound (A) include polyalkyleneimine which is a polymer of an alkyleneimine such as ethylene imine, propylene imine, butylene imine, pentylene imine, hexylene imine, heptylene imine, octylene imine, trimethylene imine, tetramethylene imine, pentamethylene imine, hexamethylene imine, or octamethylene imine; polyallylamine; and polyacrylamide.

Polyethyleneimine (PEI) can be prepared by a known method described in Japanese Patent Publication (JP-B) No. S43-8828, JP-B No. S49-33120, Japanese Patent Application Laid-Open (JP-A) No. 2001-2123958, WO 2010/137711, or the like. Polyalkyleneimines other than polyethyleneimine can also be prepared by a similar method to that of polyethyleneimine.

It is also preferable that the compound (A) is a derivative of the above-described polyalkyleneimine (polyalkyleneimine derivative; particularly preferably polyethyleneimine derivative). The derivative of polyalkyleneimine is not particularly limited as long as the derivative is a compound which can be produced using the polyalkyleneimine described above. Specific examples thereof include a derivative of polyalkyleneimine in which an alkyl group (preferably an alkyl group having from 1 to 10 carbon atoms), an aryl group, or the like is introduced into a polyalkyleneimine, and a derivative of polyalkyleneimine obtained by introducing a cross-linkable group such as a hydroxyl group into a polyalkyleneimine.

These derivatives of polyalkyleneimine can be produced by a method performed commonly using the polyalkyleneimine described above. Specifically, these derivatives of polyalkyleneimine can be produced based on the method described in, for example, JP-A No. H06-016809, or the like.

As a derivative of polyalkyleneimine, a highly branched type polyalkyleneimine obtained by increasing the branching degree of a polyalkyleneimine by reacting the polyalkyleneimine with a cationic functional group-containing monomer is also preferable.

Examples of the method of obtaining a highly branched type polyalkyleneimine include a method in which a polyalkyleneimine containing plural secondary nitrogen atoms in the backbone is reacted with a cationic functional group-containing monomer and thus at least a part of the plural secondary nitrogen atoms are substituted with the cationic functional group-containing monomer, and a method in which a polyalkyleneimine containing plural primary nitrogen atoms at terminals is reacted with a cationic functional group-containing monomer and thus at least a part of the plural primary nitrogen atoms are substituted with the cationic functional group-containing monomer.

Examples of the cationic functional group introduced in order to increase the branching degree include an aminoethyl group, an aminopropyl group, a diaminopropyl group, an aminobutyl group, a diaminobutyl group, and a triaminobutyl group, and an aminoethyl group is preferable from the viewpoint of decreasing the cationic functional group equivalent weight and increasing the cationic functional group density.

The polyethyleneimine and a derivative thereof may be a commercially available product. For example, the polyethyleneimine and a derivative thereof may be selected from those commercially available from NIPPON SHOKUBAI CO., LTD., BASF SE, MP Biomedicals, LLC., or the like if appropriate and used.

Examples of the compound (A) include a compound having a Si—O bond and an amino group in addition to the above-described aliphatic amine. Examples of the compound having a Si—O bond and an amino group include siloxane diamine, a silane coupling agent having an amino group, and a siloxane polymer of a silane coupling agent having an amino group.

Examples of the silane coupling agent having an amino group include a compound represented by the following Formula (A-3).

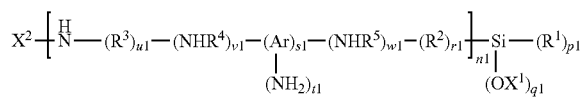

(A-3)

$p1=0$-$2$, $q1=1$-$3$, $n1=1$-$3$, $r1=0$-$1$, $s1=0$-$1$, $t1=0$-$1$, $u1=0$-$1$, $v1=0$-$1$, $w1=0$-$1$, $p1+q1=3$

In Formula (A-3), $R^1$ represents an optionally substituted alkyl group having from 1 to 4 carbon atoms. Each of $R^2$ and $R^3$ independently represents an optionally substituted alkylene group having from 1 to 12 carbon atoms (optionally containing a carbonyl group, an ether group, or the like in the skeleton), an ether group, or a carbonyl group. Each of $R^4$ and $R^5$ independently represents an optionally substituted alkylene group having from 1 to 4 carbon atoms or a single bond. Ar represents a divalent or trivalent aromatic ring. $X^1$ represents hydrogen or an optionally substituted alkyl group having from 1 to 5 carbon atoms. $X^2$ represents hydrogen, a cycloalkyl group, a heterocyclic group, an aryl group, or an optionally substituted alkyl group having from 1 to 5 carbon atoms (optionally containing a carbonyl group, an ether group, or the like in the skeleton)). A plurality of $R^1$, $R^2$, $R^3$, $R^4$, $R^5$, and $X^1$ may be the same or different.

Examples of the substituent of an alkyl group and an alkylene group in $R^1$, $R^2$, $R^3$, $R^4$, $R^5$, $X^1$, and $X^2$ each independently includes an amino group, a hydroxy group, an alkoxy group, a cyano group, a carboxylic acid group, a sulfonic acid group, and a halogen.

Examples of the divalent or trivalent aromatic ring in Ar include a divalent and trivalent benzene ring. Examples of the aryl group in $X^2$ include a phenyl group, a methylbenzyl group, and a vinylbenzyl group.

Specific examples of the silane coupling agent represented by Formula (A-3) include N-(2-aminoethyl)-3-aminopropylmethyldiethoxysilane, N-(2-aminoethyl)-3-aminopropyltriethoxysilane, N-(2-aminoethyl)-3-aminoisobutyldimethylmethoxysilane, N-(2-aminoethyl)-3-aminoisobutylmethyldimethoxysilane, N-(2-aminoethyl)-11-aminoundecyltrimethoxysilane, 3-aminopropyltrimethoxysilane, 3-aminopropyltriethoxysilane, N-phenyl-3-aminopropyltrimethoxysilane, (aminoethylaminoethyl)phenyltriethoxysilane, methylbenzylaminoethylaminopropyltrimethoxysilane, benzylaminoethylaminopropyltriethoxysilane, 3-ureidopropyltriethoxysilane, (aminoethylaminoethyl) phenethyltrimethoxysilane, (aminoethylaminomethyl) phenethyltrimethoxysilane, N-[2-[3-(trimethoxysilyl)propylamino]ethyl]ethylenediamine, 3-aminopropyldiethoxymethylsilane, 3-aminopropyldimethoxymethylsilane, 3-aminopropyldimethylethoxysilane, 3-aminopropyldimethylmethoxysilane, trimethoxy[2-(2-aminoethyl)-3-aminopropyl]silane, diaminomethylmethyldiethoxysilane, methylaminomethylmethyldiethoxysilane, p-aminophenyltrimethoxysilane, N-methylaminopropyltriethoxysilane, N-methylaminopropylmethyldiethoxysilane, (phenylaminomethyl)methyldiethoxysilane, acetamidopropyltrimethoxysilane, and hydrolysates thereof.

Examples of the silane coupling agent containing an amino group other than Formula (A-3) include N,N-bis[3-(trimethoxysilyl)propyl]ethylenediamine, N,N'-bis[3-(trimethoxysilyl)propyl]ethylenediamine, bis[(3-triethoxysilyl)propyl]amine, piperazinylpropylmethyldimethoxysilane, bis[3-(triethoxysilyl)propyl]urea, bis(methyldiethoxysilylpropyl)amine, 2,2-dimethoxy-1,6-diaza-2-silacyclooctane, 3,5-diamino-N-(4-(methoxydimethylsilyl)phenyl)benzamide, 3,5-diamino-N-(4-(triethoxysilyl)phenyl)benzamide, 5-(ethoxydimethylsilyl)benzene-1,3-diamine, and hydrolysates thereof.

The silane coupling agent having an amino group may be used singly or in combination of two or more kinds thereof. A combination of a silane coupling agent having an amino group and a silane coupling agent having no amino group may also be used. For example, a silane coupling agent having a mercapto group may be used for improving adhesiveness with a metal.

Among these silane coupling agents, a polymer (siloxane polymer) formed through a siloxane bond (Si—O—Si) may be used. For example, from a hydrolyzate of 3-aminopropyltrimethoxysilane, a polymer having a linear siloxane structure, a polymer having a branched siloxane structure, a polymer having a cyclic siloxane structure, a polymer having a cage-like siloxane structure, or the like can be obtained. The cage-like siloxane structure is represented, for example, by the following Formula (A-1).

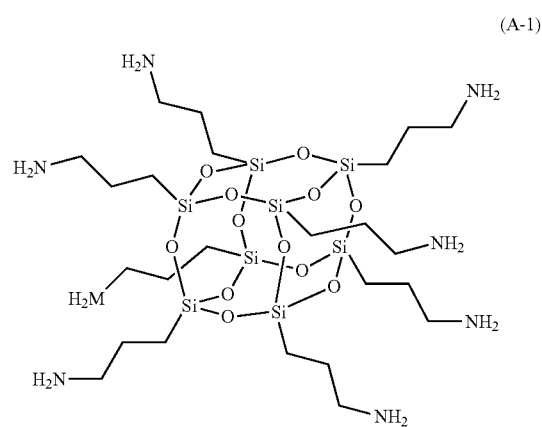

(A-1)

Examples of the siloxane diamine include a compound represented by the following Formula (A-2). In Formula (A-2), i is an integer from 0 to 4, j is an integer from 1 to 3, and Me is a methyl group.

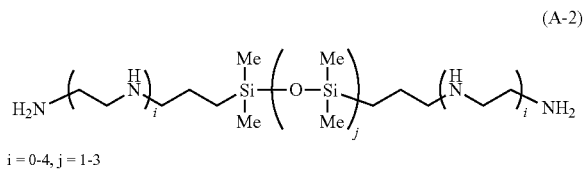

(A-2)

Examples of the siloxane diamine include 1,3-bis(3-aminopropyl)tetramethyldisiloxane (i=0, j=1 in Formula (A-2) and 1,3-bis(2-aminoethylamino)propyltetramethyldisiloxane (i=1, j=1 in Formula (A-2).

Examples of the compound (A) include amine compounds that do not have a Si—O bond and have a ring structure in the molecule in addition to the above-described aliphatic amines. Among them, amine compounds that do not have a Si—O bond, have a ring structure in the molecule and have the weight average molecular weight of from 90 to 600 are preferable. Examples of amine compounds that do not have a Si—O bond, have a ring structure in the molecule and have the weight average molecular weight of from 90 to 600 include alicyclic amines, aromatic ring amines, and heterocyclic amines. These compounds may have a plurality of ring structures in the molecule, and the plurality of ring structures may be the same or different from each other. The amine compound having a ring structure is preferably compounds having an aromatic ring since it is easy to obtain thermally stable compounds.

Further, amine compound that does not have a Si—O bond, has a ring structure in the molecule and have the weight average molecular weight of from 90 to 600 is preferably a compound having a primary amino group from the viewpoint of easily forming a thermally crosslinked structure such as amide, amide-imide, and imide together with the crosslinking agent (B) and being able to enhance heat resistance. Further, the above-described amine compound is preferably a diamine compound having two primary amino groups, a triamine compound having three primary amino groups, or the like.

Examples of the alicyclic amine include cyclohexylamine and dimethylaminocyclohexane.

Examples of the aromatic ring amine include diaminodiphenyl ether, xylenediamine (preferably para-xylenediamine), diaminobenzene, diaminotoluene, methylenedianiline, dimethyldiaminobiphenyl, bis(trifluoromethyl)diaminobiphenyl, diaminobenzophenone, diaminobenzanilide, bis(aminophenyl) fluorene, bis(aminophenoxy)benzene, bis(aminophenoxy) biphenyl, dicarboxydiaminodiphenylmethane, diaminoresorcin, dihydroxybenzidine, diaminobenzidine, 1,3,5-triaminophenoxybenzene, 2,2'-dimethylbenzidine, tris(4-aminophenyl)amine, 2,7-diaminofluorene, 1,9-diaminofluorene, and dibenzylamine.

Examples of the heterocyclic ring of a heterocyclic amine include a heterocyclic ring containing a sulfur atom as a heteroatom (for example, a thiophene ring), or a heterocyclic ring containing a nitrogen atom as a heteroatom (for example, a 5-membered ring such as a pyrrole ring, a pyrrolidine ring, a pyrazole ring, an imidazole ring, or a triazole ring; a 6-membered ring such as an isocyanuryl ring, a pyridine ring, a pyridazine ring, a pyrimidine ring, a pyrazine ring, a piperidine ring, a piperazine ring, or a triazine ring; or a condensed ring such as an indole ring, an indoline ring, a quinoline ring, an acridine ring, a naphthyridine ring, a quinazoline ring, a purine ring, or a quinoxaline ring).

Examples of heterocyclic amines having a nitrogen-containing heterocyclic ring include melamine, ammeline, melam, melem, and tris(4-aminophenyl)amine.

Examples of amine compounds having both a heterocyclic ring and an aromatic ring include N2,N4,N6-tris(4-aminophenyl)-1,3,5-triazine-2,4,6-triamine.

Since the compound (A) has a primary or secondary amino group, it is possible to be strongly adhered between the substrates by electrostatic interaction with a functional group such as a hydroxyl group, an epoxy group, a carboxy group, an amino group, or a mercapto group that may exist on the surfaces of the first substrate and the second substrate, or by densely forming a covalent bond with the functional group.

Further, since the compound (A) has a primary or secondary amino group, it easily dissolved in the polar solvent (D) described later. Since the affinity with the hydrophilic surface of a substrate such as a silicon substrate is high by using the compound (A) that is easily dissolved in the polar solvent (D), a smooth film can be easily formed and the thickness of the bonding layer can be reduced.

The compound (A) is preferably an aliphatic amine or a compound having a Si—O bond and an amino group from the viewpoint of forming a smooth thin film, and preferably a compound having a Si—O bond and an amino group from the viewpoint of heat resistance.

When which the compound (A) includes the compound having a Si—O bond and an amino group, the ratio (the total number of a primary nitrogen atom and a secondary nitrogen atom/the number of a silicon atom) of the total number of a primary nitrogen atom and a secondary nitrogen atom, and the number of a silicon atom in the compound (A) is preferably from 0.2 to 5 from the viewpoint of forming a smooth thin film.

When which the compound (A) includes the compound having a Si—O bond and an amino group, from the viewpoint of adhesion between substrates, it is preferable that a non-crosslinkable group such as the methyl group bonded to Si satisfies the relationship of (non-crosslinkable group)/Si<2 in terms of molar ratio in the compound having a Si—O bond and an amino group. By satisfying this relationship, it is assumed that the density of cross-linking (cross-linking between a Si—O—Si bond and an amide bond, an imide bond, etc.) of the formed film is improved, the substrates have sufficient adhesive strength, and the peeling of the substrates can be suppressed.

As described above, the compound (A) has a cationic functional group containing at least one of a primary nitrogen atom or a secondary nitrogen atom. Here, when which the compound (A) contains a primary nitrogen atom, the proportion of the primary nitrogen atoms in all the nitrogen atoms in the compound (A) is preferably 20% by mole or more, more preferably 25% by mole or more, and still more preferably 30% by mole or more. The compound (A) may have a cationic functional group containing a primary nitrogen atom and containing no nitrogen atoms (for example, a secondary nitrogen atom or a tertiary nitrogen atom) other than the primary nitrogen atom.

When which the compound (A) contains a secondary nitrogen atom, the proportion of the secondary nitrogen atoms in all the nitrogen atoms in the compound (A) is preferably from 5% by mole to 50% by mole, and more preferably from 10% by mole to 45% by mole.

In addition to the primary nitrogen atom and the secondary nitrogen atom, the compound (A) may contain a tertiary nitrogen atom. When which the compound (A) contains a tertiary nitrogen atom, the proportion of the tertiary nitrogen atom in all the nitrogen atoms in the compound (A) is preferably from 20% by mole to 50% by mole, and more preferably from 25% by mole to 45% by mole.

In the present disclosure, the content of a component derived from the compound (A) in the bonding layer is not particularly limited, and for example, may be from 1% by mass to 82% by mass, is preferably from 5% by mass to 82% by mass, and is more preferably from 13% by mass to 82% by mass, with respect to the total bonding layer.

(Crosslinking Agent (B))

A crosslinking agent (B) is a compound which includes three or more —C(=O)OX groups (X is a hydrogen atom or an alkyl group having from 1 to 6 carbon atoms) in the molecule, in which from one to six of three or more —C(=O)OX groups (hereinafter also referred to as "COOX") are —C(=O)OH groups (hereinafter also referred to as "COOH"), and which has a weight average molecular weight of from 200 to 600.

The crosslinking agent (B) is a compound having three or more —C(=O)OX groups in the molecule (X is a hydrogen atom or an alkyl group having from 1 to 6 carbon atoms), and is preferably a compound having from three to six —C(=O)OX groups in the molecule, and is more preferably a compound having from three or four —C(=O)OX groups in the molecule. In the crosslinking agent (B), examples of X in the —C(=O)OX group include a hydrogen atom or an alkyl group having from 1 to 6 carbon atoms, and among them, a hydrogen atom, a methyl group, an ethyl group, and a propyl group are preferable. Xs in the —C(=O)OX groups may be the same or different from each other.

The crosslinking agent (B) is a compound having from 1 to 6 —C(=O)OH groups in the molecule wherein X is a hydrogen atom, and is preferably a compound having from 1 to 4 —C(=O)OH groups in the molecule, is more preferably a compound having from 2 to 4 —C(=O)OH groups in the molecule, and is still more preferably a compound having from two or three —C(=O)OH groups in the molecule.

The crosslinking agent (B) is a compound having a weight average molecular weight of from 200 to 600. Preferably, the crosslinking agent (B) is a compound having from 200 to 400.

The crosslinking agent (B) preferably has a ring structure in the molecule. Examples of the ring structure include an alicyclic structure and an aromatic ring structure. The crosslinking agent (B) may have a plurality of ring structures in the molecule, and the plurality of ring structures may be the same or different from each other.

Examples of the alicyclic structure include an alicyclic structure having from 3 to 8 carbon atoms, and preferably an alicyclic structure having from 4 to 6 carbon atoms, and the inside of the ring structure may be saturated or unsaturated. More specific examples of the alicyclic structure include a saturated alicyclic structure such as a cyclopropane ring, a cyclobutane ring, a cyclopentane ring, a cyclohexane ring, a cycloheptane ring, or a cyclooctane ring; and an unsaturated alicyclic structure such as a cyclopropene ring, a cyclobutene ring, a cyclopentene ring, a cyclohexene ring, a cycloheptene ring, or a cyclooctene ring.

The aromatic ring structure is not particularly limited as long as the structure is a ring structure exhibiting aromaticity, and examples thereof include: a benzene aromatic ring such as a benzene ring, a naphthalene ring, an anthracene ring, or a perylene ring; an aromatic heterocyclic ring such as a pyridine ring or a thiophene ring; and a nonbenzene aromatic ring such as an indene ring or an azulene ring.

The cyclic structure of the crosslinking agent (B) in the molecule is preferably, for example, at least one selected from the group consisting of a cyclobutane ring, a cyclopentane ring, a cyclohexane ring, a benzene ring and a naphthalene ring, and from the viewpoint of further improving the heat resistance of the bonding layer, at least one of a benzene ring or a naphthalene ring is more preferable.

As described above, the crosslinking agent (B) may have a plurality of ring structures in the molecule, and may have a biphenyl structure, a benzophenone structure, a diphenyl ether structure, or the like when the ring structure is benzene.

The crosslinking agent (B) preferably has a fluorine atom in the molecule, more preferably has from 1 to 6 fluorine atoms in the molecule, and still more preferable has from 3 to 6 fluorine atoms in the molecule. For example, the crosslinking agent (B) may have a fluoroalkyl group in the molecule, and specifically may have a trifluoroalkyl group or a hexafluoroisopropyl group.

Further examples of the crosslinking agent (B) include a carboxylic acid compound such as an alicyclic carboxylic acid, a benzene carboxylic acid, a naphthalene carboxylic acid, a diphthalic acid, or a fluorinated aromatic ring carboxylic acid; and a carboxylic acid ester compound such as an alicyclic carboxylic acid ester, a benzene carboxylic acid ester, a naphthalene carboxylic acid ester, a diphthalic acid ester, or a fluorinated aromatic ring carboxylic acid ester. The carboxylic acid ester compound is a compound which includes carboxy groups (—C(=O)OH group) in the molecule and in which, in each of three or more —C(=O)OX groups, at least one X is an alkyl group having from 1 to 6 carbon atoms (in other words, an ester bond is contained). In the present disclosure, since the crosslinking agent (B) is a carboxylic acid ester compound, aggregation due to association of the compound (A) and the crosslinking agent (B) is suppressed, agglomerates and pits are reduced, and a film thickness can be easily adjusted.

The carboxylic acid compound is preferably a tetravalent or less carboxylic acid compound containing four or less —C(=O)OH groups, and more preferably a trivalent or tetravalent carboxylic acid compound containing three or four —C(=O)OH groups.

The carboxylic acid ester compound is preferably a compound containing three or less carboxy groups (—C(=O)OH groups) in the molecule and three or less ester bonds, and more preferably a compound containing two or less carboxy groups in the molecule and two or less ester bonds.

In the carboxylic acid ester compound, when, in each of three or more —C(=O)OX groups, X is an alkyl group having from 1 to 6 carbon atoms, X is preferably a methyl group, an ethyl group, a propyl group, a butyl group or the like, and from the viewpoint of further suppressing aggregation by association between the compound (A) and the crosslinking agent (B) in the composition, X is preferably an ethyl group or a propyl group.

Specific examples of the carboxylic acid compound include, but are not limited to, an alicyclic carboxylic acid such as 1,2,3,4-cyclobutane tetracarboxylic acid, 1,2,3,4-cyclopentane tetracarboxylic acid, 1,3,5-cyclohexane tricarboxylic acid, 1,2,4-cyclohexane tricarboxylic acid, 1,2,4,5-cyclohexanetetracarboxylic acid, or 1,2,3,4,5,6-cyclohexanehexacarboxylic acid; a benzene carboxylic acid such as 1,2,4-benzene tricarboxylic acid, 1,3,5-benzene tricarboxylic acid, pyromellitic acid, benzene pentacarboxylic acid, or mellitic acid; a naphthalene carboxylic acid such as 1,4,5,8-naphthalenetetracarboxylic acid or 2,3,6,7-naphthalenetetracarboxylic acid; a diphthalic acid such as 3,3',5,5'-tetracarboxydiphenylmethane, biphenyl-3,3',5,5'-tetracarboxylic acid, biphenyl-3,4',5-tricarboxylic acid, biphenyl-3,3',4,4'-tetracarboxylic acid, benzophenone-3,3',4,4'-tetracarboxylic acid, 4,4'-oxydiphthalic acid, 3,4'-oxydiphthalic acid, 1,3-bis(phthalic acid) tetramethyldisiloxane, 4,4'-(ethyne-1,2-diyl)diphthalic acid, 4,4'-(1,4-phenylenebis(oxy)) diphthalic acid, 4,4'-([1,1'-biphenyl]-4,4'-diylbis(oxy))diphthalic acid, or 4,4'-((oxybis(4,1-phenylene))bis(oxy))diphthalic acid; a perylene carboxylic acid such as perylene-3,4,9,10-tetracarboxylic acid; an anthracene carboxylic acid such as anthracene-2,3,6,7-tetracarboxylic acid; and a fluorinated aromatic carboxylic acid such as 4,4'-(hexafluoroisopropylidene)diphthalic acid, 9,9-bis(trifluoromethyl)-9H-xanthene-2,3,6,7-tetracarboxylic acid, or 1,4-ditrifluoromethyl pyromellitic acid.

Specific examples of the carboxylic acid ester compound include a compound in which at least one carboxy group in a specific example of the carboxylic acid compound is substituted with an ester group. Examples of the carboxylic acid ester compound include half esterified compounds represented by the following Formulae (B-1) to (B-6).

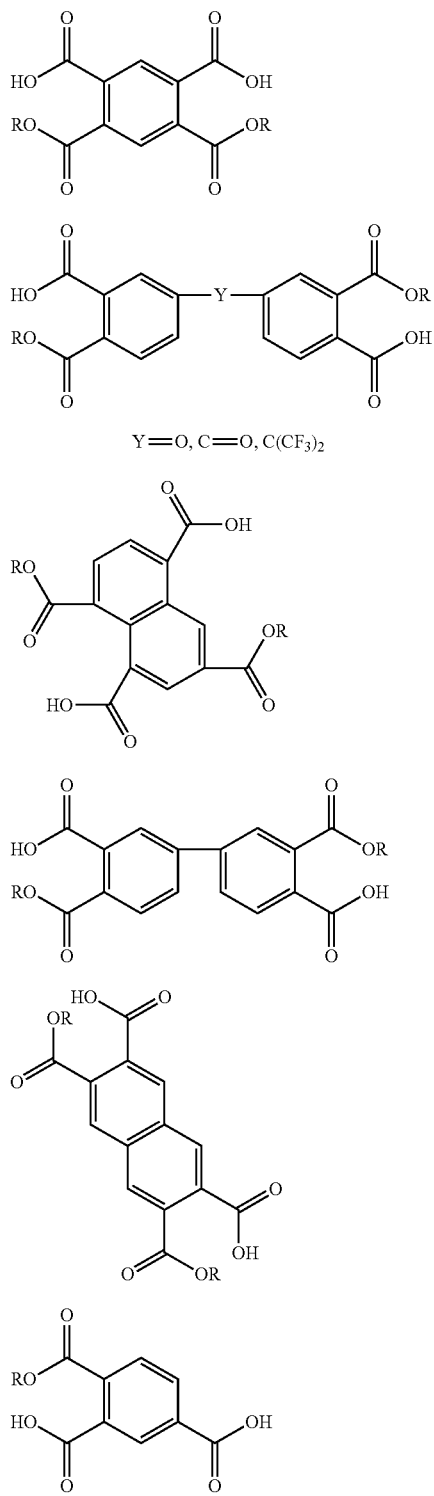

Rs in Formulae (B-1) to (B-6) are each independently an alkyl group having from 1 to 6 carbon atoms, and among these, a methyl group, an ethyl group, a propyl group, or a butyl group is preferable, and an ethyl group or a propyl group is more preferable.

The half esterified compound can be produced, for example, by mixing a carboxylic anhydride which is an anhydride of the aforementioned carboxylic acid compound in an alcohol solvent, and opening a carboxylic acid anhydride.

In the present disclosure, the content of the component derived from the crosslinking agent (B) is not particularly limited, and for example, the ratio (—(C=O)—Y/N) of the number of carbonyl groups in the component derived from the crosslinking agent (B) to the total number of nitrogen atoms in the component derived from the compound (A) is preferably from 0.1 to 3.0, more preferably from 0.3 to 2.5, and still more preferably from 0.4 to 2.2. In —(C=O)—Y/N, Y represents an imide-crosslinked or amide-crosslinked nitrogen atom, OH or ester group. When —(C=O)—Y/N is from 0.1 to 3.0, the bonding layer suitably has a crosslinked structure such as amide amide-imide or imide, and is excellent in heat resistance.

Since the compound (A) has an uncrosslinked cationic functional group, when which the compound (A) is contained and the crosslinking agent (B) is not contained as a component of the bonding layer, i is considered that the crosslinking density is low and the heat resistance is not sufficient. On the other hand, in the bonding layer, the cationic functional group of the compound (A) reacts with the carboxy group of the cross-linking agent (B) to form a covalent bond, so that the cross-linking density is increased and the bonding layer has high heat resistance.

(Polar Solvent (D))

In the first step, a solution containing the bonding material may be applied onto at least one surface of the first substrate and the second substrate. At this time, the solution containing the bonding material preferably contains the polar solvent (D) together with the bonding material such as the compound (A) and the cross-linking agent (B) described above. Here, the polar solvent (D) refers to a solvent having a relative permittivity of 5 or more at room temperature. Examples of the polar solvent (D) include protic inorganic compounds such as water and heavy water; alcohols such as methanol, ethanol, 1-propanol, 2-propanol, 1-butanol, 2-butanol, isobutyl alcohol, isopentyl alcohol, cyclohexanol, ethylene glycol, propylene glycol, 2-methoxyethanol, 2-ethoxyethanol, benzyl alcohol, diethylene glycol, triethylene glycol, and glycerin; ethers such as tetrahydrofuran and dimethoxyethane; aldehydes or ketones such as furfural, acetone, ethyl methyl ketone, and cyclohexanone; acid derivatives such as acetic anhydride, ethyl acetate, butyl acetate, ethylene carbonate, propylene carbonate, formaldehyde, N-methylformamide, N,N-dimethylformamide, N-methylacetamide, N,N-dimethylacetamide, N-methyl-2-pyrrolidone, and hexamethylphosphoramide; nitriles such as acetonitrile and propionitrile; nitro compounds such as nitromethane and nitrobenzene; or sulfur compounds such as dimethylsulfoxide. The polar solvent (D) preferably includes a protic solvent, more preferably water, and further more preferably ultrapure water.

The content of the polar solvent (D) in the solution is not particularly limited, and is, for example, with respect to the total solution, from 1.0% by mass to 99.99896% by mass, and preferably from 40% by mass to 99.99896% by mass.

A boiling point of the polar solvent (D) is preferably 150° C. or less, and preferably 120° C. or less from the viewpoint of volatilizing the polar solvent (D) by heating when forming the bonding layer and reducing the amount of residual solvent in the bonding layer.

(Additive (C))

A solution containing the bonding material may contain an additive (C) in addition to the bonding material such as the above-described compound (A) and the cross-linking agent (B), a polar solvent and the like. Examples of the additive (C) include an acid (C-1) having a carboxy group and having a weight average molecular weight of from 46 to 195, and a base (C-2) having a nitrogen atom and having a weight average molecular weight of from 17 to 120. Although the additive (C) is volatilized by heating when forming the bonding layer, the bonding layer in the substrate layered body in the present disclosure may contain the additive (C).

The acid (C-1) is an acid having a carboxy group and having a weight average molecular weight of from 46 to 195. It is assumed that, since the acid (C-1) as the additive (C) is contained, aggregation due to association of the compound (A) and the crosslinking agent (B) is suppressed by ionic bonding of an amino group in the compound (A) and a carboxyl group in the acid (C-1). More specifically, since the interaction (for example, electrostatic interaction) between an ammonium ion derived from an amino group in the compound (A) and a carboxylate ion derived from a carboxy group in the acid (C-1) is stronger than the interaction between an ammonium ion derived from an amino group in the compound (A) and a carboxylate ion derived from a carboxy group in the crosslinking agent (B), aggregation is assumed to be suppressed. It should be noted that the invention is not limited at all by the above assumption.

The acid (C-1) is not particularly limited as long as the acid has a carboxy group and has a weight average molecular weight of from 46 to 195, and examples thereof include monocarboxylic acid compounds, dicarboxylic acid compounds, and oxydicarboxylic acid compounds. More specific examples of the acid (C-1) include a formic acid, an acetic acid, a malonic acid, an oxalic acid, a citric acid, a benzoic acid, a lactic acid, a glycolic acid, a glyceric acid, a butyric acid, a methoxyacetic acid, an ethoxyacetic acid, a phthalic acid, a terephthalic acid, a picolinic acid, a salicylic acid, and a 3,4,5-trihydroxybenzoic acid.

In the present disclosure, the content of the acid (C-1) in the solution containing the bonding material is not particularly limited, and, for example, the ratio (COOH/N) of the number of carboxy groups in the acid (C-1) to the total number of nitrogen atoms in the compound (A) is preferably from 0.01 to 10, more preferably from 0.02 to 6, still more preferably from 0.5 to 3.

The base (C-2) is a base having a nitrogen atom and having a weight average molecular weight of from 17 to 120. It is assumed that, since the solution containing the bonding material contains the base (C-2) as the additive (C), aggregation due to association of the compound (A) and the crosslinking agent (B) is inhibited by ionic bonding of a carboxy group in the crosslinking agent (B) and an amino group in the base (C-2). More specifically, since the interaction between a carboxylate ion derived from a carboxy group in the crosslinking agent (B) and an ammonium ion derived from an amino group in the base (C-2) is stronger than the interaction between an ammonium ion derived from an amino group in the compound (A) and a carboxylate ion derived from a carboxy group in the crosslinking agent (B), aggregation is assumed to be suppressed. It should be noted that the invention is not limited at all by the above assumption.

The base (C-2) is not particularly limited as long as the base has a nitrogen atom and has a weight average molecular weight of from 17 to 120, and examples thereof include monoamine compounds and diamine compounds. More specific examples of the base (C-2) include ammonia, ethylamine, ethanolamine, diethylamine, triethylamine, ethylenediamine, N-acetylethylenediamine, N-(2-aminoethyl)ethanolamine, and N-(2-aminoethyl) glycine.

In the present disclosure, the content of the base (C-2) in the solution containing the bonding material is not particularly limited, and for example, the ratio (N/COOH) of the number of nitrogen atoms in the base (C-2) to the number of carboxy groups in the crosslinking agent (B) is preferably from 0.5 to 5, and more preferably from 0.9 to 3.

When which the bonding layer of the substrate layered body in the present disclosure is required to have insulating properties, tetraethoxysilane, tetramethoxysilane, bistriethoxysilylethane, bistriethoxysilylmethane, bis(methyldiethoxysilyl) ethane, 1,1,3,3,5,5-hexaethoxy-1,3,5-trisilacyclohexane, 1,3,5,7-tetramethyl-1,3,5,7-tetrahydroxylcyclosiloxane, 1,1,4,4-tetramethyl-1,4-diethoxydisylethylene, 1,3,5-trimethyl-1,3,5-trimethyl-1,3,5-triethoxy-1,3,5-trisilacyclohexane may be mixed. Further, methyltriethoxysilane, dimethyldiethoxysilane, trimethylethoxysilane and the like may be mixed in order to improve the hydrophobicity of the bonding layer having an insulating property. These compounds may be mixed to control etching selectivity.

The solution containing the bonding material may contain a solvent other than the polar solvent (D), and examples thereof include normal hexane.

The solution containing the bonding material may contain, for example, phthalic acid, benzoic acid, or a derivative thereof in order to improve the electrical characteristics. The solution containing the bonding material may contain benzotriazole or a derivative thereof, for example, in order to suppress the corrosion of copper.

A pH of the solution containing the bonding material is not particularly limited, and is preferably from 2.0 to 12.0.

When which the acid (C-1) is added as an additive (C), it is preferable to mix a mixture of the acid (C-1) and the compound (A) with the cross-linking agent (B).

In other words, the compound (A) and the acid (C-1) are preferably mixed in advance before mixing the compound (A) and the crosslinking agent (B). By this, when the compound (A) and the crosslinking agent (B) are mixed, whitening and gelation (gelation is not preferable because it may take time to make the composition transparent) of the solution containing the bonding material can be suitably suppressed.

When which the base (C-2) is added as the additive (C), it is preferable to mix the mixture of the base (C-2) and the crosslinking agent (B) with the compound (A). In other words, it is preferable to previously mix the crosslinking agent (B) and the base (C-2) before mixing the compound (A) and the crosslinking agent (B). By this, when the compound (A) and the crosslinking agent (B) are mixed, whitening and gelation (gelation is not preferable because it may take time to make the composition transparent) of the solution containing the bonding material can be suitably suppressed.

Examples of the method of applying a bonding material to the surface of at least one of the first substrate or the second substrate include a vapor phase film deposition such as vapor deposition, CVD (chemical vapor deposition), or ALD (atomic layer deposition), and an application method such as dipping, spraying, spin coating, or bar coating. When applying a bonding material by a coating method, a solution containing the above-described bonding material is preferably applied. For example, when forming a film having a micron size film thickness, bar coating is preferably used, and when forming a film having a nano size (several nm to several hundred nm) film thickness, spin coating is preferably used. The film thickness of a bonding material can be adjusted appropriately depending on an intended thickness of a bonding layer.

For example, the method of applying a bonding material by spin coating is not particularly restricted, and for example, a method of dropping a solution containing a bonding material on the surface of the first substrate while rotating the first substrate with a spin coater, and then increasing the rotation rate of the first substrate for drying can be used. In the method of applying a bonding material by spin coating, conditions such as the rotation rate of a substrate, the drop amount and drop time of a solution containing a bonding material, and the rotation rate of the substrate during drying are not particularly restricted, and may be adjusted as appropriate, taking into account the thickness of a bonding material to be formed.

In order to remove excess bonding material from a substrate on which the bonding material was applied, the substrate may be cleaned. Examples of the cleaning method include wet cleaning with a rinse solution such as a polar solvent, and plasma cleaning.

<Step of Removing Bonding Material on Electrode>

When the method of manufacturing a substrate layered body in the present disclosure includes a step of forming an electrode, the method may further include a step of removing a bonding material from the electrode after a step of applying a bonding material and before a step of forming a bonding layer. This allows the bonding material applied on the electrode surface to be removed and the electrode can be exposed. Examples of the method of removing a bonding material applied on the surface of an electrode include fly cutting, chemical mechanical polishing (CMP), and plasma dry etching. The methods of removing may be used singly or in combination of two or more methods. For example, in fly cutting, a surface planer (DFS8910 (manufactured by DISCO Corporation) or the like can be used. When using CMP, examples of slurries that may be used include slurries blended with silica or alumina, which are generally used for polishing resins, and slurries blended with hydrogen peroxide and silica, which are used for polishing metals. When using plasma dry etching, fluorocarbon plasma, oxygen plasma, or the like may be used.

<Step of Forming Bonding Layer (Second Step)>

The method of manufacturing a substrate layered body in the present disclosure includes a step (second step) of curing the bonding material applied on the surface to form a bonding layer having a reduced modulus at 23° C. of 10 GPa or less. In the second step, for example, a bonding material applied on the surface of the substrate is cured by heating or the like to form a bonding layer. In this step, when the bonding material contains a thermosetting compound, the bonding material is cured by heating the bonding material at a temperature above the curing temperature.

In the second step, the bonding material applied on the surface is preferably heated and cured at from 100° C. to 450° C.

The above-described temperature refers to the temperature of the surface of the bonding material applied on the surface.

By heating the bonding material, a solvent in a solution containing the bonding material is removed. Components in the bonding material react to yield a cured product, and a bonding layer containing the cured product is formed.

The above-described temperature is preferably from 150° C. to 450° C., and more preferably from 180° C. to 400° C.

The pressure at which heating is performed in the second step is not particularly limited, and an absolute pressure of 17 Pa or less is preferable.

The above-described absolute pressure is preferably from 1,000 Pa to atmospheric pressure, more preferably from 5,000 Pa to atmospheric pressure, and particularly preferably from 10,000 Pa to atmospheric pressure.

Heating in the second step can be performed by a usual method using a furnace or a hot plate. Examples of the furnace that can be used include SPX-1120 manufactured by APPEX CORPORATION, and VF-1000LP manufactured by Koyo Thermo Systems Co., Ltd.

Heating in the second step may be performed in an atmospheric atmosphere or in an inert gas (nitrogen gas, argon gas, helium gas, or the like) atmosphere.

The heating time in the second step is not limited, and for example, is 3 hours or less, and preferably 1 hour or less. The lower limit of the heating time is not particularly limited, and can be, for example, 5 minutes.

For the purpose of shortening the time of the second step, the bonding material applied on the surface may be irradiated with ultraviolet (UV) light. For ultraviolet rays, ultraviolet lights with wavelengths of from 170 nm to 230 nm, excimer light with wavelength of 222 nm, and excimer light with wavelength of 172 nm are preferable. It is preferable to perform ultraviolet irradiation under an inert gas atmosphere.

Whether a bonding material is cured or not can be confirmed, for example, by measuring the peak intensity of a specific bond and a specific structure by FT-IR (Fourier Transform Infrared Spectroscopy). Examples of the specific bond and specific structure include a bond and a structure generated by a crosslinking reaction.

For example, when an amide bond, an imide bond, a siloxane bond, a tetrahydronaphthalene structure, an oxazole ring structure, or the like is formed, it is determined that the bonding material has cured, and the peak intensity derived from these bonds and structures, or the like, can be confirmed by measurement by FT-IR.

An amide bond can be confirmed by the presence of vibrational peaks at about 1,650 $cm^{-1}$ and about 1,520 $cm^{-1}$.

An imide bond can be confirmed by the presence of vibrational peaks at about 1,770 $cm^{-1}$ and about 1,720 $cm^{-1}$.

A siloxane bond can be confirmed by the presence of a vibrational peak between 1,000 $cm^{-1}$ and 1,080 $cm^{-1}$.

A tetrahydronaphthalene structure can be confirmed by the presence of a vibrational peak of 1,500 $cm^{-1}$.

An oxazole ring structure can be confirmed by the presence of vibrational peaks of about 1,625 $cm^{-1}$ and about 1,460 $cm^{-1}$.

A bonding layer formed by curing a bonding material preferably includes a siloxane bond and at least one of an amide bond or an imide bond.

The degree of curing of a bonding layer obtained by curing a bonding material may be confirmed, for example, by measuring the peak intensities of specific bonds and structures (or the sum of peak intensities in the case of a plurality of peaks, such as for an imide, an amide, and the like) in the bonding material before applied to a substrate, in a bonding layer before the third step, and in the bonding layer after the third step, by FT-IR (Fourier Transform Infrared Spectroscopy) to determine the increase rate or decrease rate of the peak intensities. When there are banded peaks that are difficult to separate, such as siloxane bonds, the maximum peak intensity can be employed.

Specifically, when a curing reaction generates a specific bond and a specific structure, the increase rate of the peak intensity may be calculated using the following equation, and the calculated value may be used as the degree of curing of a bonding layer.

> Increase rate of peak intensity (degree of curing of bonding layer)=[(peak intensity of specific bond and structure of bonding layer before third step)/(peak intensity of specific bond and structure of bonding layer after heating at 300° C. for 1 hour in third step)]×100

Background signal removal can be performed by a usual method. If necessary, an FT-IR measurement can be performed by a transmission method or a reflection method.

In the above-described increase rate of peak intensity, when there are a plurality of bonds and structures causing an increase in the peak intensity, the peak intensity may be read as the sum of the plurality of peak intensities.

From the viewpoint of suitably suppressing misalignment, the degree of curing of a bonding layer is preferably 70% or more, more preferably 80% or more, still more preferably 85% or more, still more preferably 90% or more, and particularly preferably 93% or more. The degree of curing of a bonding layer may be 100%, 99% or less, 95% or less, or 90% or less. The degree of curing of a bonding layer herein refers to the degree of curing of a bonding layer after a step of forming a bonding layer and before a step of bonding the first substrate to the second substrate.

The amount of silicon on the surface of a bonding layer is preferably 20 atomic percent or less, more preferably 15 atomic percent or less, and still more preferably 10 atomic percent or less.

The amount of silicon on the surface of a bonding layer can be evaluated by measuring the atomic ratio with an X-ray photoelectron spectrometer (XPS). Specifically, using AXIS-NOVA (manufactured by Kratos Analytical Ltd.) that is an XPS, the atomic ratio can be measured from the peak intensity of the narrow spectrum, where the total amount of each element detected in the wide spectrum is set to 100%.

From the viewpoint of suitably suppressing formation of voids, the reduced modulus at 23° C. of a bonding layer is preferably 8 GPa or less, and more preferably 6 GPa or less. From the viewpoint of suitably suppressing misalignment, the reduced modulus at 23° C. of a bonding layer is preferably 0.1 GPa or more, and more preferably 1 GPa or more.

From the viewpoint of increasing the bonding strength between the first substrate and the second substrate in a temporarily fixed layered body (hereinafter also referred to as "temporarily fixed substrate layered body") as described below, and a substrate layered body, a bonding layer formed on the first substrate preferably includes a functional group that can form a chemical bond on the surface of a bonding layer. Examples of such a functional group include an amino group, an epoxy group, a vinyl group, and a silanol group (Si—OH group), and from the viewpoint of heat resistance, a silanol group is preferable. These functional groups may be formed by a surface treatment after formation of a bonding layer, or may be formed by a silane coupling agent treatment or the like. Alternatively, a compound containing these functional groups may be mixed into a bonding material.

A bonding layer formed on at least one of the first substrate or the second substrate preferably contains a Si—OH group on the surface. The presence of a Si—OH group on the surface of a bonding layer facilitates temporary fixation described below at a low temperature when the first substrate and the second substrate are bonded. Furthermore, it is possible to increase the bonding strength at the interface between the first substrate and the second substrate after a bonding step. The surface energy of the interface between the first substrate and the second substrate is preferably 2.5 (J/m$^2$) or more.

Whether or not the surface of a bonding layer contains a Si—OH group can be evaluated by analyzing the surface of the bonding layer by time-of-flight secondary ion mass spectrometry (TOF-SIMS). Specifically, whether or not the surface of a bonding layer contains a Si—OH group can be evaluated by the presence or absence of a mass-to-charge ratio (m/Z) 45 peak using PHI nanoTOFII (ULVAC-PHI, Inc.) that is a TOF-SIMS.

<Step of Removing Bonding Layer on Electrode>

When the method of manufacturing a substrate layered body in the present disclosure includes a step of forming an electrode, the method may further include a step of removing a bonding layer from the electrode after a step of forming a bonding layer and before a step of bonding the first substrate and the second substrate. This allows the bonding layer on the electrode surface to be removed and the electrode can be exposed. Examples of the method of removing a bonding layer from the surface of an electrode include fly cutting, chemical mechanical polishing (CMP), and plasma dry etching. The methods of removing may be used singly or in combination of two or more methods. For example, in fly cutting, a surface planer (DFS8910 (manufactured by DISCO Corporation) or the like can be used. When using CMP, examples of slurries that may be used include slurries blended with silica or alumina, which are generally used for polishing resins, and slurries blended with hydrogen peroxide and silica, which are used for polishing metals. When using plasma dry etching, fluorocarbon plasma, oxygen plasma, or the like may be used.

When a bonding layer on the surface of an electrode is removed to expose the electrode, reduction of an oxide on the surface of the electrode may be performed, if necessary. Examples of the reduction treatment method include a method of heating a substrate in an acid atmosphere, such as formic acid, at from 100° C. to 300° C., and a method of heating a substrate in a hydrogen atmosphere. These treatments may be performed at the same time as a bonding step (third step) described below.

After forming a bonding layer, the surface of the bonding layer may be flattened. Examples of the flattening method include fly cutting and chemical mechanical polishing (CMP). The flattening methods may be used singly or in combination of two or more kinds thereof.

As described below, when the first substrate and the second substrate are bonded after temporary fixation, the surface roughness (Ra) of the bonding layer is preferably 1.2 nm or less.

The surface roughness of the bonding layer can be evaluated by morphological observation with a scanning probe microscope (SPM). Specifically, the surface roughness is obtained by measuring in a 3 μm×3 μm square area using SPA400 (manufactured by Hitachi High-Tech Corporation) that is an SPM in dynamic force microscope mode.

If necessary, the surface of a bonding layer may be cleaned. Examples of the cleaning method include wet cleaning with a rinse solution and plasma cleaning.

<Step of Bonding First Substrate and Second Substrate (Third Step)>

The method of manufacturing a substrate layered body in the present disclosure includes a step (third step) of bonding the first substrate and the second substrate via the bonding layer formed. In the third step, for example, the first substrate and the second substrate are brought into contact with each other via the bonding layer formed in the second step to form a layered body. Subsequently, the first substrate and the second substrate are bonded together. If necessary, this layered body is heated to bond the first substrate and the second substrate together. When bonding layers are formed on the first substrate and the second substrate, respectively, it is preferable to bond the surfaces of the first substrate and the second substrate where the bonding layers are formed to each other.

A step of temporarily fixing the first substrate and the second substrate may be included after the first substrate and the second substrate are brought into contact with each other to form a layered body. In other words, the first substrate and the second substrate may be temporarily fixed and then bonded together. Temporary fixing of the first substrate and the second substrate is preferably performed at a low temperature between room temperature and 100° C.

When the first substrate and the second substrate includes a silicon substrate, from the viewpoint of ease of handling, minimizing misalignment (bonding displacement), minimizing contamination, and the like in the step of bonding the first substrate and the second substrate, the surface energy at the bonding interface between the two substrates with the first substrate and the second substrate temporarily fixed is preferably 0.05 J/m² or more, more preferably 0.1 J/m² or more, and still more preferably 0.15 J/m² or more.

The surface energy (bonding strength) of the bonding interface of the temporarily fixed substrate layered body can be determined by a blade insertion test in accordance with the method of Non Patent Document, M. P. Maszara, G. Goetz, A. Cavigila, and J. B. Mckitterick, *Journal of Applied Physics*, 64 (1988) 4943-4950. A blade with a thickness of from 0.1 to 0.3 mm is inserted at the bonding interface of the temporarily fixed substrate layered body, and the distance of separation of the layered body from the blade edge is measured with an infrared light source and an infrared camera. Then, the surface energy can be determined based on the following equation.

$$\gamma = 3 \times 10^9 \times t_b^2 E^2 \times t^6 / (32 \times L^4 \times E \times t^3)$$

where γ is the surface energy (J/m²), $t_b$ is the blade thickness (m), E is the Young's modulus of the silicon substrate in the first substrate and the second substrate (GPa), t is the thickness of the first substrate and the second substrate (m), and L is the detachment distance (m) of the layered body from the blade edge.

The pressure when the first substrate and the second substrate are bonded in the third step is not particularly limited, and is preferably from more than an absolute pressure of $10^{-4}$ Pa to atmospheric pressure.

The absolute pressure is preferably from $10^{-3}$ Pa to atmospheric pressure, more preferably from 100 Pa to atmospheric pressure, and particularly preferably from 1,000 Pa to atmospheric pressure.

When the first substrate and the second substrate are bonded in the third step, the bonding may be performed under an atmospheric atmosphere or under an inert gas (nitrogen gas, argon gas, helium gas, or the like) atmosphere.

In the third step, the bonding layer is preferably heated at from 100° C. to 450° C. with the first substrate and the second substrate in contact with each other via the bonding layer.

The above-described temperature refers to the temperature of the surface of the first substrate or the second substrate on which the bonding layer is formed.

The above-described temperature is preferably from 100° C. to 400° C., and more preferably from 150° C. to 300° C.

Heating in the third step can be performed by a usual method using a furnace or a hot plate.

Heating in the third step may be performed in an atmospheric atmosphere or in an inert gas (nitrogen gas, argon gas, helium gas, or the like) atmosphere.

The heating time in the third step is not limited, and for example, is 3 hours or less, and preferably 1 hour or less. The lower limit of the heating time is not particularly limited, and can be, for example, 5 minutes.

In the third step, from the viewpoint of increasing the bonding strength of the first substrate and the second substrate, a layered body in a state in which the first substrate and the second substrate are in contact with each other via the bonding layer may be pressurized. The pressurization may be performed simultaneously with heating.

The pressure for pressurizing the above-described layered body is not particularly limited, and is preferably from 0.1 MPa to 10 MPa, more preferably from 0.1 MPa to 5 MPa. For example, TEST MINI PRESS manufactured by Toyo Seiki Seisaku-sho, Ltd. can be used as a pressurizing device.

<Step of Forming Functional Group (Surface Treatment Step)>

The method of manufacturing a substrate layered body in the present disclosure may further include a step (also referred to as "surface treatment step") of forming at least one functional group selected from the group consisting of a hydroxyl group, an epoxy group, a carboxy group, an amino group, and a mercapto group by performing surface treatment on the surface on the side of at least one of the first substrate or the second substrate in contact with the bonding layer, preferably the surface on the side of the first substrate and the second substrate in contact with the bonding layer. This tends to increase the bonding strength between the substrates.

Examples of the surface treatment include a plasma treatment, a chemical treatment, and an ozone treatment such as a UV ozone treatment.

A hydroxyl group can be provided on the surfaces of the first substrate and the second substrate by performing a surface treatment such as a plasma treatment, a chemical treatment, or an ozone treatment such as a UV ozone treatment, respectively, on those surfaces.

A hydroxyl group is preferably bonded with at least one element selected from the group consisting of Si, Al, Ti, Zr, Hf, Fe, Ni, Cu, Ag, Au, Ga, Ge, Sn, Pd, As, Pt, Mg, In, Ta, and Nb contained in the first substrate or the second substrate. Among them, it is more preferable that the surface of at least one of the first substrate or the second substrate on which the bonding layer is formed includes a silanol group containing a hydroxyl group.

Epoxy groups can be provided on the surfaces of the first substrate and the second substrate, respectively, by performing a surface treatment such as silane coupling with epoxy silane on those surfaces.

Carboxy groups can be provided on the surfaces of the first substrate and the second substrate by surface treatment such as silane coupling with carboxysilane, respectively, on those surfaces.

Amino groups can be provided on the surfaces of the first substrate and the second substrate by surface treatment such as silane coupling with amino silane, respectively, on those surfaces.

Mercapto groups can be provided on the surfaces of the first substrate and the second substrate by surface treatment such as silane coupling with mercaptosilane, respectively, on those surfaces.

When the bonding layer is formed on both the first substrate and the second substrate, from the viewpoint of increasing the bonding strength of a substrate layered body, at least one surface of the bonding layers may be subjected to the above-described surface treatment.

From the viewpoint of increasing the bonding strength of a substrate layered body, a primer such as a silane coupling agent may be deposited on the surface to which a bonding material of at least one of the first substrate or the second substrate is applied, and when a bonding layer is formed on both the first substrate and the second substrate, a primer such as a silane coupling agent may be deposited on at least one surface of the bonding layers.

The thickness of the above-described bonding layer in the substrate layered body is preferably from 0.001 µm to 8.0 µm, more preferably from 0.01 µm to 6.0 µm, and still more preferably from 0.03 µm to 5.0 µm. When the thickness of the bonding layer is 0.001 µm or more, the bonding strength between the substrates can be increased. When the thickness of the bonding layer is 8.0 µm or less, the thickness variation of the bonding layer can be suppressed when the bonding layer is formed on a large area of a substrate.

When an electrode is provided on the surface of at least one of the first substrate or the second substrate on the bonding layer side, from the viewpoint of improving the bonding strength and suppressing the thickness variation of the bonding layer, the thickness of the above-described bonding layer in the substrate layered body is preferably from 0.01 µm to 8.0 µm, more preferably from 0.03 µm to 6.0 µm, and still more preferably from 0.05 µm to 5.0 µm.

When an electrode is not provided on the surface of the first substrate and the second substrate on the bonding layer side, from the viewpoint of improving the bonding strength and suppressing the thickness variation of the bonding layer, the thickness of the above-described bonding layer in the substrate layered body is preferably from 0.001 µm to less than 1.0 µm, more preferably from 0.01 µm to 0.8 µm, and still more preferably from 0.03 µm to 0.6 µm.

The surface energy of the bonding interface between the first substrate and the second substrate in the substrate layered body is preferably 2 $J/m^2$ or more, more preferably 2.1 $J/m^2$ or more, and still more preferably 2.5 ($J/m^2$) or more.

From the viewpoint of excellent heat resistance, a cured material contained in the bonding layer preferably includes at least one of an amide bond or an imide bond, and more preferably includes an imide bond.

The content of sodium and potassium in the bonding layer is preferably 10 mass ppb or less on an elemental basis, respectively. When the content of sodium or potassium is 10 mass ppb or less on an elemental basis, respectively, the occurrence of inconveniences in the electrical characteristics of a semiconductor device, such as malfunction of a transistor, can be suppressed.

In the substrate layered body in the present disclosure, an additional substrate may be further layered on at least one of the first substrate or the second substrate on the opposite side of the bonding layer side. The preferred material of the additional substrate is the same as a preferred material of the first substrate and the second substrate. The material of the additional substrate may be the same as or different from at least one of the first substrate or the second substrate.

In the substrate layered body in the present disclosure, after the second step or after the third step, if necessary, at least one of the first substrate or the second substrate may be subjected to thinning process (back grinding).

In the substrate layered body, after the second step or after the third step, a dicing process may be performed and a substrate may be diced, if necessary. For example, in the dicing process, a dicer (DAD6340 (manufactured by DISCO Corporation)) or the like can be used.

(Examples of Layered Structure of Substrate Layered Body)

The following are examples of the layered structure of a substrate layered body in each application.

For MEMS packaging; Si/bonding layer/Si, $SiO_2$/bonding layer/Si, $SiO_2$/bonding layer/$SiO_2$, Cu/bonding layer/Cu, and For microfluidics; PDMS/bonding layer/PDMS, PDMS/bonding layer/$SiO_2$, For CMOS image sensors; $SiO_2$/bonding layer/$SiO_2$, Si/bonding layer/Si, $SiO_2$/bonding layer/Si, $SiO_2$/bonding layer/Si, For through-silicon vias (TSV); $SiO_2$ (with Cu electrode)/bonding layer/$SiO_2$ (with Cu electrode), Si (with Cu electrode)/bonding layer/Si (with Cu electrode), For optical devices; (InGaAlAs, InGaAs, InP, GaAs)/bonding layer/Si, and For LEDs; (InGaAlAs, GaAs, GaN)/bonding layer/Si, (InGaAlAs, GaAs, GaN)/bonding layer/$SiO_2$, (InGaAlAs, GaAs, GaN)/bonding layer/(Au, Ag, Al), (InGaAlAs, GaAs, GaN)/bonding layer/Sapphire.

[Layered Body]

The layered body in the present disclosure includes a substrate and a bonding layer formed on the substrate, wherein the bonding layer is formed by curing a bonding material and has a reduced modulus at 23° C. of 10 GPa or less. By bonding the above-described layered body with another substrate via a bonding layer, a substrate layered body with suppressed void generation and misalignment can be obtained, as in the above-described method of manufacturing a substrate layered body in the present disclosure. The description of the preferred configuration of a substrate used in the layered body in the present disclosure and another substrate as described above is the same as the first substrate and the second substrate as described above, and therefore is omitted.

EXAMPLES

In the following, the invention will be described in detail by way of Examples, but the invention is not limited to these Examples.

In the following, ultrapure water (Millipore Milli-Q water manufactured by Millipore Corporation, resistance 18 MΩ-cm (25° C.) or less) was used as the "water". Each evaluation was performed by the following method.

<Crosslinking Structure>

The crosslinking structure of a bonding layer was measured by FT-IR (Fourier Transform Infrared Spectroscopy). The analyzer used was as follows.

—FT-IR Analyzer—

Infrared Absorption Analyzer (DIGILAB Excalibur (manufactured by DIGILAB Inc.))

—Measurement Conditions—

IR light source: air-cooled ceramic,

Beam Splitter: Wide-range KBr,

Detector: Peltier cooled DTGS,

Measured wavenumber range: 7,500 $cm^{-1}$ to 400 $cm^{-1}$,

Resolving power: 4 $cm^{-1}$,

Integration times: 256,
Background: Si bare wafers used,
Measuring atmosphere: $N_2$ (10 L/min), and
Incidence angle of IR (infrared): 72° (=Brewster angle of Si)

—Determination Conditions—

Imide bonds were determined by the presence of vibrational peaks at 1,770 $cm^{-1}$ and 1,720 $cm^{-1}$. Siloxane bonds were determined by the presence of vibrational peaks between 1,000 $cm^{-1}$ and 1080 $cm^{-1}$. Amide bonds were determined by the presence of vibrational peaks at 1,650 $cm^1$ and 1,520 $cm^{-1}$.

<Measurement of Reduced Modulus>

For measurement samples prepared in Examples and Comparative Examples, an unloaded-displacement curve at 23° C. was measured at a test depth of 20 nm using Nano-indenter (trade name: TI-950 Tribo Indenter, manufactured by Hysitron, Berkovich indenter), and the reduced modulus at 23° C. was calculated from the maximum load and maximum displacement in accordance with the calculation method of References (Handbook of Micro/nano Tribology (second edition), edited by Bharat Bhushan, CRC Press, LLC).

Here, the reduced modulus is defined by the following Mathematical Formula (1). In Mathematical Formula (1), $E_r$ represents the reduced modulus, $E_i$ represents the Young's modulus of an indenter, which is 1,140 GPa, $v_i$ represents the Poisson's ratio of the indenter, which is 0.07, and $E_s$ and vs represent the Young's modulus and Poisson's ratio of a sample, respectively.

$$\frac{1}{E_r} = \frac{1-v_i^2}{E_i} + \frac{1+v_s^2}{E_s} \quad (1)$$

<Measurement of Surface Roughness (Ra)>

Measurement was performed on a 3 μm×3 μm square area with an SPM SPA400 (manufactured by Hitachi High-Tech Corporation) that is a scanning probe microscope (SPM) in dynamic force microscope mode.

<Measurement of Water Droplet Contact Angle>

The static contact angle of water was measured using a solid-liquid interface analysis system (DropMaster 500 image processing formula, manufactured by Kyowa Interface Science Co., Ltd.) at 23° C. and 50% humidity.

<Calculation of Degree of Curing>

For a bonding layer formed, FT-IR measurements were performed before and after heating at 300° C. for 1 hour, and the degree of curing was calculated using the above-described Formula.

<Measurement of Amount of Silicon on Surface of Bonding Layer>

The amount of silicon on the surface of a bonding layer was evaluated by measuring the atomic ratio with an X-ray photoelectron spectrometer (XPS), AXIS-NOVA (manufactured by Kratos Analytical Ltd.), from the peak intensity of the narrow spectrum of each element, where the total amount of each element detected in the wide spectrum is set to 100%.

<Evaluation of Presence or Absence of Silanol Group on Surface of Bonding Layer>

Whether or not the surface of a bonding layer contains a Si—OH group was evaluated by the presence or absence of a mass-to-charge ratio (m/Z) 45 peak using a time-of-flight secondary ion mass spectrometry (TOF-SIMS), PHI nano-TOFII (ULVAC-PHI, Inc.).

<Measurement of Void Width>

The void widths around the Cu wiring pattern were measured by observing a substrate layered body with an ultrasonic microscope. The void widths (void widths from the edge of the Cu wiring pattern) were determined at four locations around a straight portion of the Cu wiring pattern, and the arithmetic mean thereof was obtained as the void widths.

<Measurement of Surface Energy>

The surface energy (bonding strength) of the bonding interface of a temporarily fixed substrate layered body or a resulting substrate layered body was measured by the blade insertion test in accordance with the method in Non Patent Document, M. P. Maszara, G. Goetz, A. Cavigila, and J. B. Mckitterick, Journal of Applied Physics, 64 (1988) 4943-4950. A blade with a thickness of from 0.1 to 0.3 mm was inserted into the bonding interface of a temporarily fixed substrate layered body or a substrate layered body, the distance of separation of the layered body or substrate layered body from the edge of the blade was measured with an infrared light source and an infrared camera, and then the surface energy was measured based on the following equation.

$$\gamma = 3 \times 10^9 \times t_b^2 \times E^2 \times t^6 / (32 \times L^4 \times E \times t^3)$$

where γ is the surface energy (J/$m^2$), $t_b$ is the blade thickness (m), E is the Young's modulus of the silicon substrate in the first substrate and the second substrate (GPa), t is the thickness of the first substrate and the second substrate (m), and L is the detachment distance (m) of the layered body from the blade blade edge or the substrate layered body.

Example 1

<Preparation of Solution Containing Bonding Material>

A solution containing a bonding material was prepared. Details are described below.

As the bonding material, a hydrolysate of 2 g of 3-aminopropyl diethoxymethylsilane (3APDES; (3-Aminopropyl) diethoxymethylsilane) and 1.6 g of pyromellitic acid half ester (R in Formula (B-1) is an ethyl group) were prepared. These were added to 96.4 g of a mixed solution of water, ethanol, and 1-propanol (water:ethanol:1-propanol=31.3: 31.7:33.4, mass ratio) to prepare a solution containing the bonding material.

<Preparation of Substrates>

A first substrate (surface roughness (Ra) on the $SiO_x$ side 0.17 nm, water droplet contact angle 10° or less) with a $SiO_x$ film (500 nm thick, reduced modulus 70 GPa) formed by plasma CVD using tetraethoxysilane (TEOS) as a precursor on a silicon substrate (diameter 100 mm) and a second substrate with a $SiO_x$ film (thickness 500 nm, reduced modulus 70 GPa, surface roughness (Ra) 0.17 nm, water droplet contact angle 100 or less) formed on a silicon substrate (100 mm in diameter) in the same manner, and a Cu wiring pattern (line width 0.1 mm and height 20 nm) formed on the $SiO_x$ film were prepared.

<Formation of Bonding Layer>

The first substrate prepared as described above was placed on a spin coater with the side on which the $SiO_x$ film was formed vertically upward, 2.0 mL of a solution containing the prepared bonding material was dropped at a constant rate for 10 seconds, held for 23 seconds, rotated at 4,000 rpm (rpm is rotational speed) for 1 second, rotated at 600 rpm for 30 seconds, then rotated at 2,000 rpm for 10 seconds to dry. The bonding material was thus applied on the first substrate.

The first substrate on which the bonding material was applied was heated at 400° C. for 10 minutes under a nitrogen atmosphere. A bonding layer (thickness 64 nm) with a siloxane bond and an imide bond was thus formed.

<Measurement of Reduced Modulus>

The reduced modulus of a bonding layer and a $SiO_x$ film was measured as follows. First, a composition of 10% by mass of 3APDES and 8% by mass of pyromellitic acid half ester was prepared by the same method as in Example 1 as a bonding material, spin coated on a silicon substrate, and a measurement sample was prepared by heating at 400° C. for 10 minutes. The thickness of the bonding material was 660 nm. The $SiO_x$ film was formed by plasma CVD using tetraethoxysilane (TEOS) as a precursor on the silicon substrate to prepare the measurement sample. The thickness of the $SiO_x$ film was 500 nm. The reduced modulus of the prepared sample was calculated as described above. The reduced modulus of the bonding layer was 4.2 GPa.

For the bonding layer of Example 1, the surface roughness (Ra) was 0.30 nm, the water droplet contact angle was 70°, the degree of curing was 95% or more, and the amount of silicon on the surface was 7.9 atomic percent. The presence (TOF-SIMS peak count of $3\times10^{-4}$) of a silanol group on the surface of the bonding layer was confirmed.

<Manufacturing of Substrate Layered Body>

The first substrate and the second substrate were brought into contact with each other via the bonding layer formed as described above, and after the temperature was raised from room temperature to 250° C., thermocompression was applied under reduced pressure conditions using a heat press device for 30 minutes at 1.65 MPa. Then, by cooling, a substrate layered body composed of the first substrate, the bonding layer, and the second substrate was manufactured.

The void width of the substrate layered body obtained in Example 1 was 3 mm. The surface energy at the bonding interface between the first substrate and the second substrate of the substrate layered body was 2.12 $J/m^2$.

Comparative Example 1

<Manufacturing of Substrate Layered Body>

The first substrate and the second substrate were prepared in the same manner as in Example 1.

The amount of silicon on the surface of the $SiO_x$ film of the first substrate was 33 atomic percent. The presence (TOF-SIMS peak count of $1\times10^{-5}$) of a silanol group on the surface of the $SiO_x$ film of the first substrate was confirmed.

A bonding material was not applied to the first substrate, the first substrate and the second substrate were brought into contact with each other in such a manner that the surfaces on which a $SiO_x$ film (thickness 500 nm, reduced modulus 70 GPa) was formed were facing each other, and after the temperature was raised from room temperature to 250° C., thermocompression was applied under reduced pressure conditions using a heat press device for 30 minutes at 1.65 MPa. Then, by cooling, a substrate layered body composed of the first substrate and the second substrate was manufactured.

<Measurement of Void Width>

The void width was measured in the same manner as for the substrate layered body obtained in Example 1.

The void width of the substrate layered body obtained in Comparative Example 1 was 16 mm. The surface energy at the bonding interface between the first substrate and the second substrate of the substrate layered body obtained in Comparative Example 1 was 0.16 $J/m^2$.

Example 2

A solution containing the bonding material prepared in Example 1 was used.

Figure 1B:
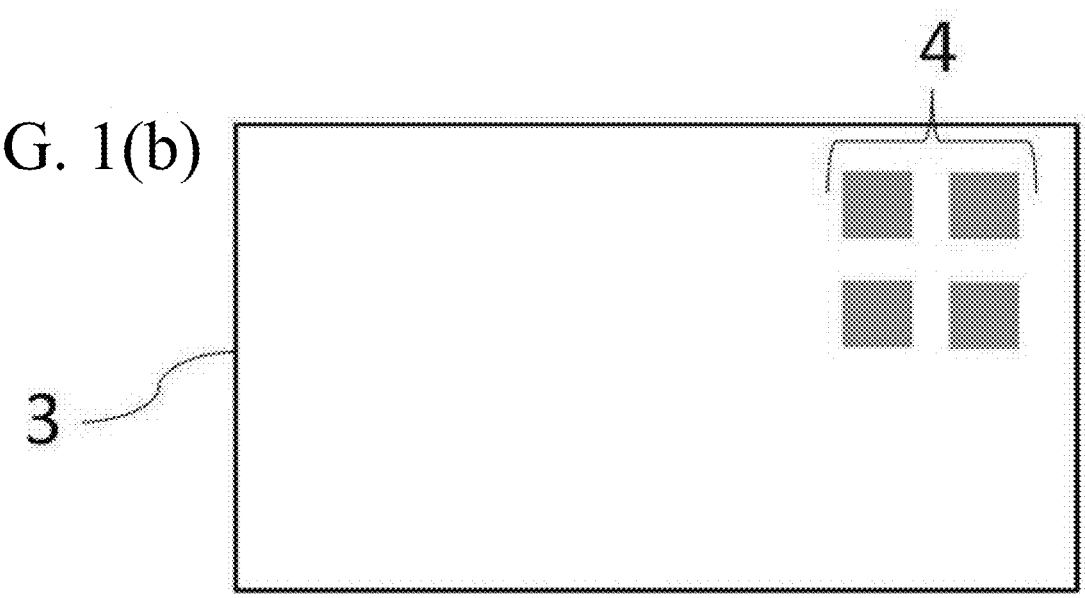

A first substrate with a $SiO_x$ film (500 nm thick, reduced modulus 70 GPa) formed by plasma CVD using tetraethoxysilane (TEOS) as a precursor on a silicon substrate and a second substrate with a $SiO_x$ film (thickness 500 nm, reduced modulus 70 GPa) formed on a silicon substrate in the same manner formed on the $SiO_x$ film were prepared. Then, a pattern for alignment accuracy measurement was formed in the $SiO_x$ films in the first substrate and the second substrate. Specifically, as shown in FIG. 1, a cross-shaped alignment mark 2 was formed on the first substrate 1 and an alignment mark 4 corresponding to the above-described cross-shaped alignment mark 2 was formed on the second substrate 3.

After applying a bonding material to the first substrate as in Example 1, a bonding layer was formed by heating the first substrate at 400° C. for 10 minutes in a nitrogen atmosphere, and then contacting the first substrate and the second substrate via the bonding layer in such a manner that the alignment marks of the first substrate and the second substrate were aligned, and the substrate layered body was manufactured in the same manner as in Example 1.

For the bonding layer formed on the first substrate in Example 2, the degree of curing, the reduced modulus, the amount of silicon on the surface, the presence or absence of a silanol group on the surface, the surface roughness (Ra), and the water droplet contact angle were the same as for the bonding layer formed on the first substrate in Example 1. The surface energy at the bonding interface between the first substrate and the second substrate of the substrate layered body obtained in Example 2 was the same as that of the substrate layered body obtained in Example 1.

<Measurement of Misalignment Amount>

Figure 2:
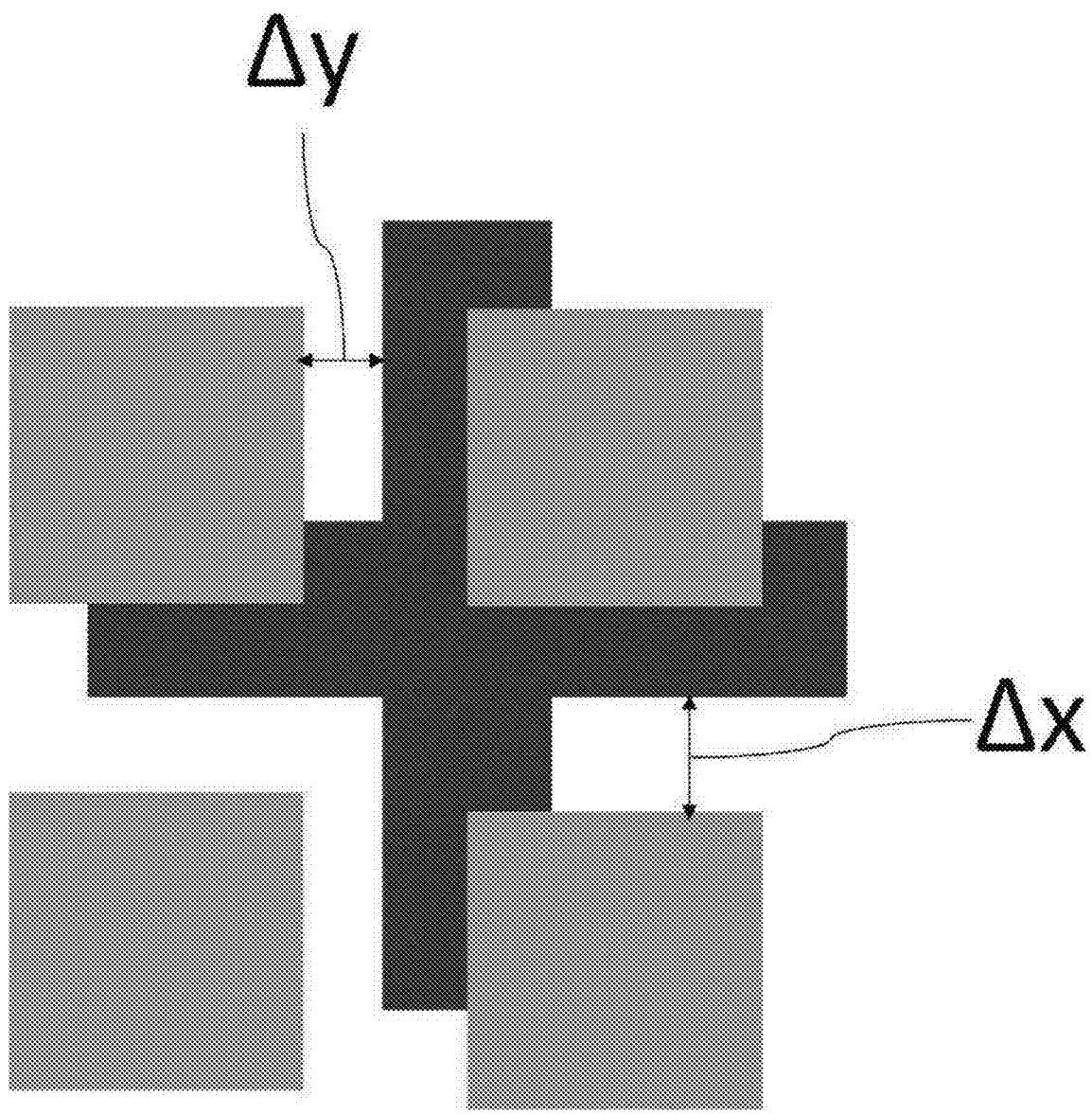
FIG. 2 is a schematic diagram illustrating misalignment of alignment marks when the first substrate and the second substrate are bonded in Example 2.

The amount of misalignment was measured by observing the substrate layered body obtained in Example 2 with an infrared microscope. Specifically, as shown in FIG. 2, the misalignments in two directions, Δx and Δy, respectively, were determined, and Δx+Δy was defined as the misalignment amount.

The misalignment amount of the substrate layered body obtained in Example 2 was 5 m or less.

It is known that when substrates are bonded to each other in a state (B-stage state) in which a solution containing benzocyclobutene as a bonding material is dried without curing, a misalignment of from 20 m to 40 μm occurs (Non Patent Document 3: *Microsystem Technology*, 2015, vol. 21, pp. 1633-1641).

From the results of Examples 1 and 2, it was found that a substrate layered body with suppressed void generation and misalignment can be manufactured.

Example 3

<Preparation of Solution Containing Bonding Material>

A solution containing a bonding material was prepared. Details are described below.

As the bonding material, a hydrolysate of 9 g of 3-aminopropyl diethoxymethylsilane (3APDES; (3-Aminopropyl) diethoxymethylsilane) and 7.3 g of pyromellitic acid half ester (R in Formula (B-1) is an ethyl group) were prepared. These were added to 28.7 g of a mixed solution of water, ethanol, and 1-propanol (water:ethanol:1-propanol=31.3: 64.7:4.0, mass ratio) to prepare a solution containing the bonding material.

<Preparation of Substrates>

A $SiO_x$ film (thickness 100 nm) was formed on a silicon substrate in the same manner as in Example 1, and cylindrical copper electrodes (diameter 22 μm, height 2.8 μm, pitch 40 μm) were formed thereon, and a first substrate and a second substrate cut into a 50 mm×50 mm piece were prepared.

<Formation of Bonding Layer>

The first substrate prepared as described above was placed on a spin coater with the side on which a copper electrode was formed vertically upward, 2.0 mL of a solution containing the prepared bonding material was dropped at a constant rate for 10 seconds, held for 23 seconds, rotated at 2,000 rpm for 1 second, rotated at 600 rpm for 30 seconds, then rotated at 2,000 rpm for 10 seconds to dry. The bonding material was thus applied on the first substrate. The first substrate on which the bonding material was applied was heated at 200° C. for 30 minutes under a nitrogen atmosphere. A bonding layer (thickness in a region on a $SiO_x$ film where no copper electrode was formed 2.6 μm, reduced modulus 6.5 GPa) with a siloxane bond and an imide bond was thus formed. A bonding material was also attached onto a copper electrode.

A bonding layer (thickness in a region on a $SiO_x$ film where no copper electrode was formed 2.6 μm, reduced modulus 6.5 GPa) was formed on the surface of the second substrate in the same manner.

The amount of silicon and the presence or absence of a silanol group on the surface of the bonding layer formed on the first substrate and the second substrates were the same as in Example 1.

<Exposure of Copper Electrode>

The surfaces of the first substrate and the second substrate, on which the bonding layer was formed, were fly cut using a surface planer (DFS8910 (manufactured by DISCO Corporation)) to expose a copper electrode. The thickness of the bonding layer on the $SiO_x$ film after fly cutting was about 1.2 μm, and the thickness of the copper electrode on the $SiO_x$ film was about 1.2 μm.

<Manufacturing of Substrate Layered Body>

The bonding layers of the first substrate and the second substrate processed as described above were brought into contact with each other and heated from room temperature to 250° C., and then thermocompression was applied for 5 minutes at 10 MPa. Then, by cooling, a substrate layered body composed of the first substrate, the bonding layer, and the second substrate was manufactured.

<Calculation of Degree of Curing>

For the bonding layer formed on the first substrate in the above-described <Formation of Bonding Layer>, the degree of curing was calculated in the same manner as in Example 1, resulting in 95% or more.

<Determining Presence or Absence of Void Between Substrates>

The substrate layered body manufactured in Example 3 was cut, and a cross section of the substrate layered body was observed by scanning electron microscope to determine the presence or absence of a void between the substrates.

No voids were observed in the cross section of the substrate layered body obtained in Example 3.

Example 4

<Preparation of Solution Containing Bonding Material>

A solution containing a bonding material was prepared. Details are described below.

As the bonding material, a hydrolysate of 3.15 g of 3-aminopropyl diethoxymethylsilane (3APDES; (3-Aminopropyl)diethoxymethylsilane) and 3.3 g of 4,4'-oxydiphthalic acid half ester (R in Formula (B-1) is an ethyl group) were prepared. These were added to 14.55 g of a mixed solution of water, ethanol, and 1-propanol (water:ethanol:1-propanol=26.4:25.5:48.1, mass ratio) to prepare a solution containing the bonding material.

<Preparation of Substrates>

A $SiO_x$ film (thickness 100 nm) that is a thermal oxide film, was formed on a silicon substrate, and cylindrical copper electrodes (diameter 22 μm, height 2.8 μm, pitch 40 μm) were formed thereon, and a first substrate and a second substrate cut into a 50 mm×50 mm piece were prepared.

<Formation of Bonding Layer>

The first substrate prepared as described above was placed on a spin coater with the side on which a copper electrode was formed vertically upward, 2.0 mL of a solution containing the prepared bonding material was dropped at a constant rate for 10 seconds, held for 23 seconds, rotated at 2,000 rpm for 1 second, rotated at 600 rpm for 30 seconds, then rotated at 2,000 rpm for 10 seconds to dry. The bonding material was thus applied on the first substrate. The first substrate on which the bonding material was applied was heated at 200° C. for 30 minutes under a nitrogen atmosphere. A bonding layer (thickness in a region on a $SiO_x$ film where no copper electrode was formed 2.8 μm, reduced modulus 5.8 GPa) with a siloxane bond and an imide bond was thus formed. A bonding material having a thickness of 1.0 μm was also formed on a copper electrode.

A bonding layer (thickness in a region on a $SiO_x$ film where no copper electrode was formed 2.8 μm, reduced modulus 5.8 GPa) was formed on the surface of the second substrate in the same manner. The amount of silicon on the surface was 6.5 atomic percent. The presence (TOF-SIMS peak count of $2 \times 10^{-4}$) of a silanol group on the surface of the bonding layer was confirmed.

<Exposure of Copper Electrode>

The surfaces of the first substrate and the second substrate on which a bonding layer was formed were polished with a silica slurry (manufactured by COMPOL80 (Fujimi Incorporated)) using a CMP device (ARW-8C1MS (manufactured by Kemet Japan Co., Ltd.)) to remove a bonding material from a copper electrode, and to expose the copper electrode, and the substrates after CMP were cleaned with a post-CMP cleaning solution (CMP-B01 (manufactured by Kanto Chemical Co., Inc.)). The thickness of the bonding layer on the $SiO_x$ film in a region where no copper electrode was formed after CMP was 2.4 μm, and the surface roughness (Ra) of the bonding layer was 0.60 nm. Using a contact surface step meter (Profilometer P16+ (manufactured by KLA-Tencor Corporation)), a step between the bonding layer and an exposed copper electrode was measured, and the copper electrode was found to be 60 nm more convex than the surface of the bonding layer.

Subsequently, the copper electrode was polished with a slurry containing hydrogen peroxide and silica, and the substrate after CMP was cleaned with a post-CMP cleaning solution (CMP-BO1 (manufactured by Kanto Chemical Co., Inc.)). The thickness of the bonding layer on the $SiO_x$ film in a region where no copper electrode was formed after CMP was 2.3 μm. Using a contact surface step meter, a step between the bonding layer and an exposed copper electrode was measured, and the copper electrode was found to be 100 nm more concave than the surface of the bonding layer.

Figure 3A:
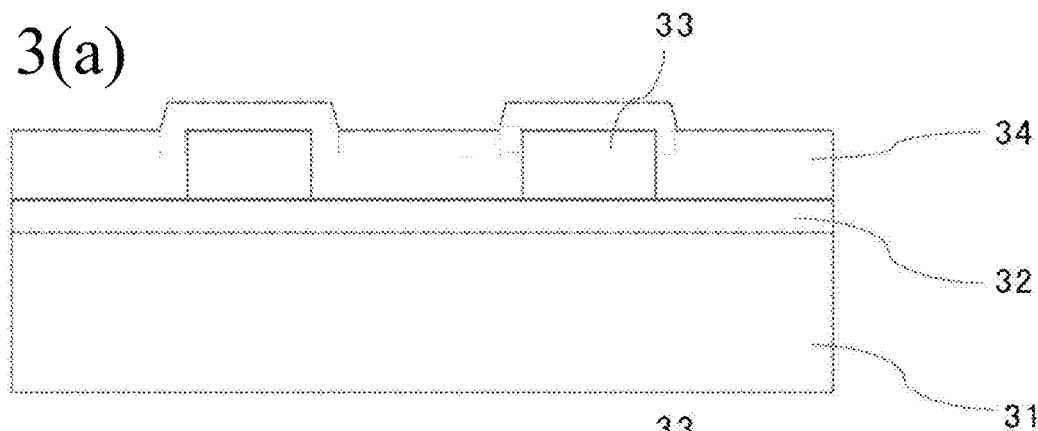
FIG. 3 is a diagram illustrating state of copper electrodes and a bonding layer in <Exposure of Copper Electrodes> in Example 4.
Figure 3B:
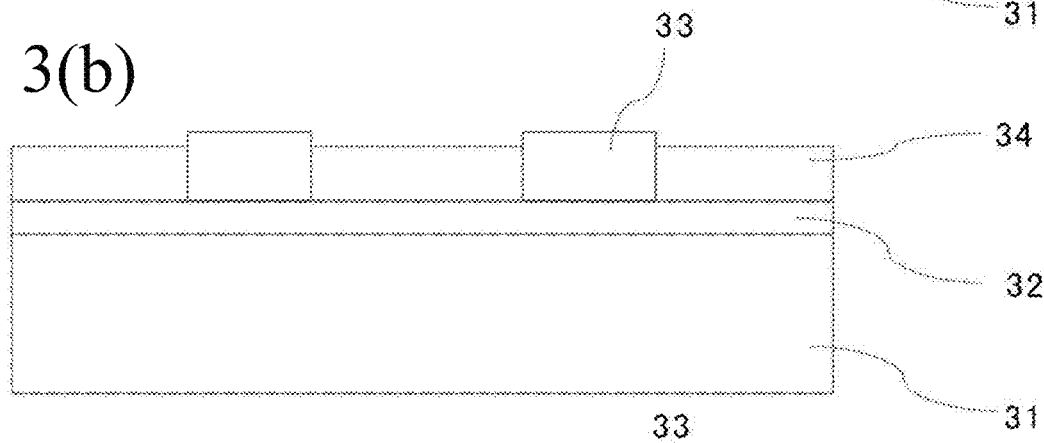
Figure 3C:
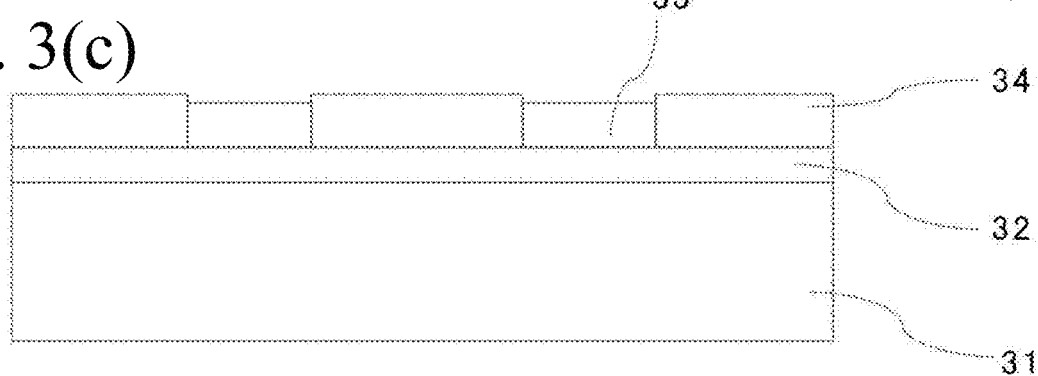

The state of the copper electrode and the bonding layer in <Exposure of Copper Electrode> in Example 4 will be described using FIG. 3. In (a) of FIG. 3, a $SiO_x$ film 32 and a copper electrode 33 were formed in this order on a substrate 31, and a bonding layer 34 was formed on top of the $SiO_x$ film 32 and the copper electrode 33. In (b) of FIG. 3, the bonding material on the copper electrode 33 was removed and the copper electrode 33 was exposed in a state in which the copper electrode 33 was 60 nm more convex than the surface of the bonding layer 34. In (c) of FIG. 3, the copper electrode 33 was polished, and the copper electrode 33 was exposed in a state in which the copper electrode 33 was 100 nm more concave than the surface of the bonding layer 34.

<Manufacturing of Substrate Layered Body>

The bonding layers of the first substrate and the second substrate processed as described above were brought into contact with each other and heated from room temperature to 250° C. using a heat press device under atmospheric conditions, and then thermocompression was applied for 1 minute at 5 MPa. Then, by cooling, a substrate layered body composed of the first substrate, the bonding layer, and the second substrate was manufactured.

<Calculation of Degree of Curing>

For the bonding layer formed on the first substrate in the above-described <Formation of Bonding Layer>, the degree of curing was calculated in the same manner as in Example 1, resulting in 95% or more.

<Determining Presence or Absence of Void Between Substrates>

The presence or absence of a void between the substrates was determined in the same manner as in Example 3.

No voids were observed in the cross section of the substrate layered body obtained in Example 4.

Example 5

<Preparation of Solution Containing Bonding Material>

A solution containing the bonding material prepared in Example 1 was used.

<Preparation of Substrates>

A first substrate and a second substrate in which $SiO_2$ films (thickness 2 nm, surface roughness (Ra) 0.09 nm, and water droplet contact angle 10° or less), which were naturally oxidized films, were formed on silicon substrates (diameter 100 mm), were prepared. Both substrates were subjected to hydrophilization treatment by UV ozone treatment.

<Formation of Bonding Layer>

The first substrate prepared as described above was placed on a spin coater, 2.0 mL of a solution containing the prepared bonding material was dropped at a constant rate for 10 seconds, held for 13 seconds, rotated at 2,000 rpm for 1 second, rotated at 600 rpm for 30 seconds, then rotated at 2,000 rpm for 10 seconds to dry. The bonding material was thus applied on the first substrate. The first substrate on which the bonding material was applied was heated at 400° C. for 10 minutes under a nitrogen atmosphere. A bonding layer (degree of curing 95% or more, thickness 103 nm, reduced modulus 4.2 GPa, surface roughness (Ra) 0.30 nm, water droplet contact angle 69°) with a siloxane bond and an imide bond was thus formed.

The amount of silicon on the surface of the bonding layer and the presence or absence of a silanol group were the same as in Example 1.

<Manufacturing of Temporary Fixed Substrate Layered Body>

The first substrate and the second substrate were brought in contact with each other via the bonding layer formed as described above at room temperature (23° C.) under air, and a temporarily fixed substrate layered body composed of the first substrate, the bonding layer, and the second substrate was manufactured.

<Measurement of Surface Energy>

The surface energy of the bonding interface of the above-described temporarily fixed substrate layered body was 0.24 $J/m^2$.

<Manufacturing of Substrate Layered Body>

The first substrate and the second substrate were bonded by heating the temporarily fixed substrate layered body formed as described above at 400° C. for 30 minutes under a nitrogen atmosphere to obtain a substrate layered body.

<Measurement of Surface Energy>

For the substrate layered body described above, the surface energy of the bonding interface between the first substrate and the second substrate was measured, and the surface energy was found to be 2.5 $J/m^2$ or more (measurement limit).

Example 6

<Preparation of solution Containing Bonding Material>

A solution containing a bonding material was prepared in the same manner as in Example 1, except that the content of 3APDES was set at 20% by mass and the content of pyromellitic acid half ester was set at 16% by mass.

<Formation of Bonding Layer>

A bonding layer (degree of curing 95% or more, thickness 2.5 m, reduced modulus 4.2 GPa, water droplet contact angle 69°) was formed on the first substrate in the same manner as in Example 5, except that the thickness of the bonding layer was set to 2.5 μm and the surface roughness (Ra) was set to 0.21 nm.

The amount of silicon on the surface of the bonding layer and the presence or absence of a silanol group were the same as in Example 1.

<Manufacturing of Temporary Fixed Substrate Layered Body>

A temporarily fixed substrate layered body composed of the first substrate, the bonding layer, and the second substrate was manufactured in the same manner as in Example 5.

The surface energy of the bonding interface of the temporarily fixed substrate layered body was 1.2 $J/m^2$.

<Manufacturing of Substrate Layered Body>

The first substrate and the second substrate were bonded in the same manner as in Example 5 for the temporarily fixed substrate layered body formed as described above to obtain a substrate layered body. The surface energy of the bonding interface of the first substrate and the second substrate was 2.5 $J/m^2$ or more (measurement limit).

Example 7

<Preparation of Solution Containing Bonding Material>

A solution containing a bonding material was prepared in the same manner as in Example 1.

<Preparation of Substrates>

A first substrate in which a SiO$_2$ film (thickness 2 nm, surface roughness (Ra) 0.09 nm, and water droplet contact angle 100 or less), which was a naturally oxidized film, was formed on a silicon substrate (diameter 100 mm), and a second substrate in which a SiCN film (thickness 15 nm, surface roughness (Ra) 0.16 nm, contact angle of water droplets 10° or less) was formed by plasma CVD on a silicon substrate (diameter 100 mm) were prepared. Both substrates were subjected to hydrophilization treatment by UV ozone treatment.

<Formation of Bonding Layer>

A bonding layer (degree of curing 95% or more, thickness 103 nm, reduced modulus 4.2 GPa, surface roughness (Ra) 0.30 nm, water droplet contact angle 69°) was formed on the first substrate in the same manner as in Example 5.

The amount of silicon on the surface of the bonding layer and the presence or absence of a silanol group were the same as in Example 1.

<Manufacturing of Temporary Fixed Substrate Layered Body>

A temporarily fixed substrate layered body composed of the first substrate, the bonding layer, and the second substrate was manufactured in the same manner as in Example 5.

The surface energy of the bonding interface of the temporarily fixed substrate layered body was 2.5 J/m$^2$ or more (measurement limit).

<Manufacturing of Substrate Layered Body>

The first substrate and the second substrate were bonded in the same manner as in Example 5 for the temporarily fixed substrate layered body formed as described above to obtain a substrate layered body. The surface energy of the bonding interface of the first substrate and the second substrate was 2.5 J/m$^2$ or more (measurement limit).

Example 8

<Preparation of Solution Containing Bonding Material>

A solution containing a bonding material was prepared in the same manner as in Example 1.

<Preparation of Substrates>

A first substrate in which a SiO$_2$ film (thickness 2 nm, surface roughness (Ra) 0.09 nm, and water droplet contact angle 100 or less), which was a naturally oxidized film, was formed on a silicon substrate (diameter 100 mm), and a second substrate in which a silicon nitride film (thickness 150 nm, surface roughness (Ra) 0.68 nm, contact angle of water droplets 100 or less) was formed by plasma CVD on a silicon substrate (diameter 100 mm) were prepared. Both substrates were subjected to hydrophilization treatment by UV ozone treatment.

<Formation of Bonding Layer>

A bonding layer (degree of curing 95% or more, thickness 103 nm, reduced modulus 4.2 GPa, surface roughness (Ra) 0.30 nm, water droplet contact angle 69°) was formed on the first substrate in the same manner as in Example 5.

The amount of silicon on the surface of the bonding layer and the presence or absence of a silanol group were the same as in Example 1.

<Manufacturing of Temporary Fixed Substrate Layered Body>

A temporarily fixed substrate layered body composed of the first substrate, the bonding layer, and the second substrate was manufactured in the same manner as in Example 5.

The surface energy of the bonding interface of the temporarily fixed substrate layered body was 2.2 J/m$^2$.

<Manufacturing of Substrate Layered Body>

The first substrate and the second substrate were bonded in the same manner as in Example 5 for the temporarily fixed substrate layered body formed as described above to obtain a substrate layered body. The surface energy of the bonding interface between the first substrate and the second substrate was 2.5 J/m$^2$ or more (measurement limit).

Comparative Example 2

<Preparation of Substrates>

A first substrate in which a SiO$_2$ film (thickness 2 nm, surface roughness (Ra) 0.09 nm, and water droplet contact angle 10° or less), which was a naturally oxidized film, was formed on a silicon substrate (diameter 100 mm), and a second substrate in which a silicon nitride film (thickness 150 nm, surface roughness (Ra) 0.68 nm, contact angle of water droplets 100 or less) was formed by plasma CVD on a silicon substrate (diameter 100 mm) were prepared. Both substrates were subjected to hydrophilization treatment by UV ozone treatment.

<Manufacturing of Temporary Fixed Substrate Layered Body>

An attempt was made to manufacture a temporarily fixed substrate layered body composed of a first substrate, a bonding layer, and a second substrate by bringing a SiO$_2$ film surface of the first substrate into contact with the silicon nitride film surface of the second substrate at room temperature (23° C.) under air, without applying any bonding material to the first substrate or the second substrate, but temporary fixing failed to be achieved.

<Manufacturing of Substrate Layered Body>

The SiO$_2$ film surface of the first substrate and the silicon nitride film surface of the second substrate were brought into contact with each other and heated at 400° C. for 30 minutes under a nitrogen atmosphere, but the substrates were not bonded together.

Comparative Example 3

<Preparation of Substrates>

A first substrate in which a SiO$_2$ film (thickness 2 nm, surface roughness (Ra) 0.09 nm, and water droplet contact angle 100 or less), which was a naturally oxidized film, was formed on a silicon substrate (diameter 100 mm), and a second substrate in which a silicon nitride film (thickness 500 nm, surface roughness (Ra) 1.45 nm, contact angle of water droplets 10° or less) was formed by plasma CVD on a silicon substrate (diameter 100 mm) were prepared. Both substrates were subjected to hydrophilization treatment by UV ozone treatment.

<Manufacturing of Temporary Fixed Substrate Layered Body>

An attempt was made to manufacture a temporarily fixed substrate layered body composed of a first substrate, a bonding layer, and a second substrate by bringing a SiO$_2$ film surface of the first substrate into contact with the silicon nitride film surface of the second substrate at room temperature (23° C.) under air, without applying any bonding material to the first substrate or the second substrate, but temporary fixing failed to be achieved.

<Manufacturing of Substrate Layered Body>

The SiO$_2$ film surface of the first substrate and the silicon nitride film surface of the second substrate were brought into contact with each other and heated at 400° C. for 10 minutes under a nitrogen atmosphere, but the substrates were not bonded together.

Example 9

<Preparation of solution Containing Bonding Material>

A solution containing a bonding material was prepared in the same manner as in Example 1, except that the content of 3APDES was set at 20% by mass and the content of pyromellitic acid half ester was set at 16% by mass.

<Preparation of Substrates>

A first substrate and a second substrate in which $SiO_2$ films (thickness 2 nm, surface roughness (Ra) 0.09 nm, and water droplet contact angle 100 or less), which were naturally oxidized films, were formed on silicon substrates (diameter 100 mm), were prepared. Both substrates were subjected to hydrophilization treatment by UV ozone treatment.

<Formation of Bonding Layer>

A bonding layer (degree of curing 95% or more, thickness 2.5 μm, reduced modulus 4.2 GPa, surface roughness (Ra) 0.21 nm, water droplet contact angle 69°) was formed on the first substrate in the same manner as in Example 5.

The amount of silicon on the surface of the bonding layer and the presence or absence of a silanol group were the same as in Example 1.

A dicing tape was applied to the first substrate on which the bonding layer was formed, obtained above on the side on which the bonding layer was not formed, and fixed. Using a dicer (DISCO Corporation, DAD6340), the first substrate fixed to a dicing tape and having a bonding layer formed was diced into 10 mm×10 mm squares. Furthermore, particles generated by dicing were washed with water.

<Manufacturing of Temporarily Fixed Substrate Layered Body>

The $SiO_2$ film-formed surfaces of the first substrate and the second substrate were brought into contact with each other at room temperature (23° C.) under air via the bonding layer formed as described above, and a temporarily fixed substrate layered body composed of the first substrate, the bonding layer, and the second substrate was manufactured. In this step, the diced first substrate on which the bonding layer was formed was brought into contact with the second substrate, with the first substrate fixed to the dicing tape. After manufacturing the temporarily fixed substrate layered body, the dicing tape stuck to the back of the first substrate was pulled off and removed.

<Manufacturing of Substrate Layered Body>

The temperature of the temporarily fixed substrate layered body formed as described above was raised from room temperature to 250° C., and then thermocompression was applied at 250° C. for 10 minutes under 1 MPa in a nitrogen atmosphere. Then, by cooling, the first substrate and the second substrate were bonded together to obtain a substrate layered body.

<Measurement of Misalignment Amount>

The misalignment amount was measured by observing the temporarily fixed substrate layered body and the substrate layered body obtained in Example 9 with an optical microscope.

Figure 4A:
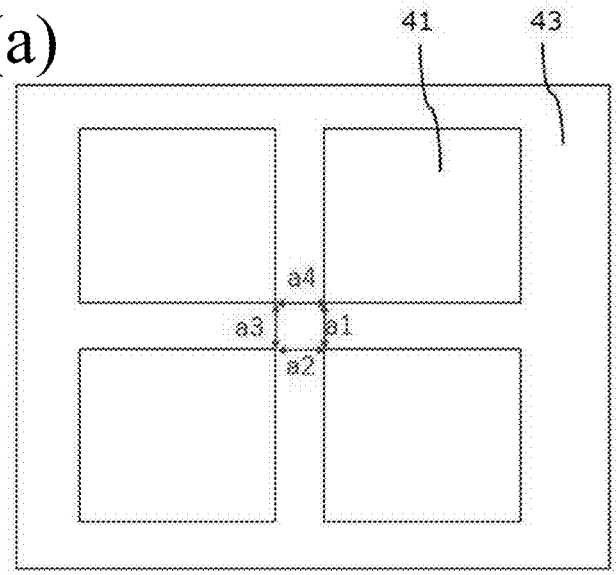
FIG. 4(a) is a diagram of a temporarily fixed substrate layered body in which a first substrate is temporarily fixed on a second substrate via a bonding layer, viewed from the opposite side of the surface where the bonding layer of the first substrate is formed.

Specifically, as illustrated in FIG. 4(a), in a temporarily fixed substrate layered body, inter-vertex distances (inter-chip distances) a1, a2, a3, and a4 between adjacent diced separated chips of the first substrate on which the bonding layer was formed were measured by optical microscopy. FIG. 4 (a) is a diagram of a temporarily fixed substrate layered body in which a first substrate 41 was temporarily fixed on a second substrate 43 via a bonding layer, viewed from the opposite side of the surface where the bonding layer of the first substrate 41 was formed.

Figure 4B:
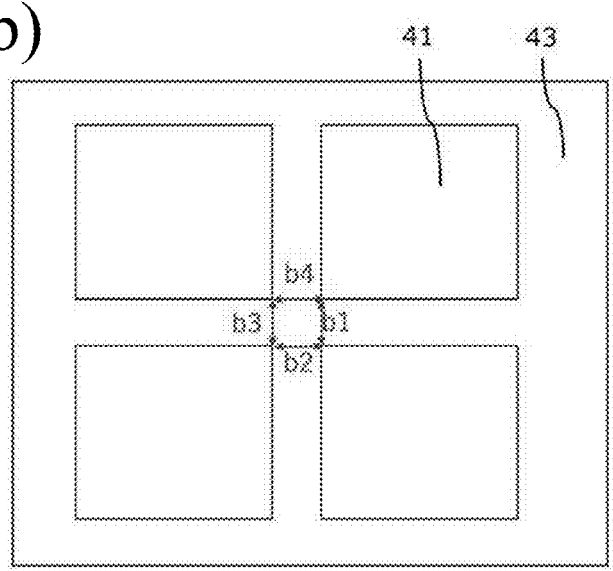
FIG. 4(b) is a diagram of a substrate layered body in which the first substrate is joined to the second substrate via the bonding layer, viewed from the opposite side of the surface where the bonding layer of the first substrate is formed, in Example 9.

After bonding a temporarily fixed substrate layered body by thermocompression, similarly, as illustrated in FIG. 4(b), in a substrate layered body, inter-vertex distances (inter-chip distances) b1, b2, b3, and b4 between adjacent diced separated chips of the first substrate on which the bonding layer was formed were measured by optical microscopy. FIG. 4 (b) is a diagram of a substrate layered body in which a first substrate 41 was bonded on a second substrate 43 via a bonding layer, viewed from the opposite side of the surface where the bonding layer of the first substrate 41 was formed.

$\Delta 1 = a1 - b1$, $\Delta 2 = a2 - b2$, $\Delta 3 = a3 - b3$, and $\Delta 4 = a4 - b4$ were calculated, and the absolute values of $\Delta 1$, $\Delta 2$, $\Delta 3$, and $\Delta 4$ were defined as misalignment amounts, respectively.

Similarly, the absolute values of the differences $\Delta 1$, $\Delta 2$, $\Delta 3$, and $\Delta 4$ of inter-vertex distances between adjacent separated chips of the first substrate on which the bonding layer was formed were measured at seven locations different from the above described locations, and the misalignment amount of the substrate layered body was less than 1 μm at all seven locations.

From the results of Example 9, it was found that a substrate layered body with suppressed misalignment can be manufactured.

Example 10

<Preparation of Solution Containing Bonding Material>

A solution containing a bonding material was prepared in the same manner as in Example 4.

<Preparation of Substrates>

A first substrate and a second substrate were prepared in the same manner as in Example 9.

<Formation of Bonding Layer>

The first substrate prepared as described above was placed on a spin coater, 2.0 mL of a solution containing the prepared bonding material was dropped at a constant rate for 10 seconds, held for 23 seconds, rotated at 2,000 rpm for 1 second, rotated at 600 rpm for 30 seconds, then rotated at 2,000 rpm for 10 seconds to dry. The bonding material was thus applied on the first substrate. The first substrate on which the bonding material was applied was heated at 200° C. for 30 minutes under a nitrogen atmosphere. A bonding layer (degree of curing 95% or more, thickness 2.8 μm, reduced modulus 5.8 GPa, surface roughness (Ra) 0.20 nm) with a siloxane bond and an imide bond was thus formed. The amount of silicon on the surface of the bonding layer and the presence or absence of a silanol group were the same as in Example 4.

The first substrate on which the bonding layer was formed, obtained above, was diced, and furthermore, particles were washed in the same way as in Example 9.

<Manufacturing of Temporarily Fixed Substrate Layered Body>

After manufacturing a temporarily fixed substrate layered body in the same manner as in Example 9, the dicing tape stuck to the back of the first substrate was pulled off and removed.

<Manufacturing of Substrate Layered Body>

A substrate layered body was obtained in the same manner as in Example 9.

<Measurement of Misalignment Amount>

The misalignment amount was measured in the same manner as in Example 9. The misalignment amount of the substrate layered body was less than 1 μm at all seven locations.

Example 11

<Preparation of Solution Containing Bonding Material>

A solution containing a bonding material was prepared in the same manner as in Example 4, except that a hydrolysate of 1.26 g of (3-aminopropyl) diethoxymethylsilane (3AP-DES) and 1.32 g of 4,4'-oxydiphthalic acid half ester (R in Formula (B-1) was an ethyl group) were used.

<Preparation of Substrates>

A first substrate and a second substrate were prepared in the same manner as in Example 5.

<Formation of Bonding Layer>

The first substrate and the second substrate prepared as described above were each placed on a spin coater, 2.0 mL of a solution containing the prepared bonding material was dropped at a constant rate for 10 seconds, held for 13 seconds, rotated at 2,000 rpm for 1 second, rotated at 600 rpm for 30 seconds, then rotated at 2,000 rpm for 10 seconds to dry. The bonding material was thus applied on each of the first substrate and the second substrate. The first substrate and the second substrate on which the bonding material was applied were each heated at 400° C. for 10 minutes under a nitrogen atmosphere. A bonding layer (degree of curing 95% or more, thickness 350 nm, reduced modulus 5.5 GPa) with a siloxane bond and an imide bond was thus formed.

The amount of silicon on the surface of the bonding layer and the presence or absence of a silanol group were the same as in Example 4.

<Formation of Copper Electrode>

A copper electrode with a thickness of 100 nm, a diameter of 2 mm, and a pitch of 10 mm was formed on the surface of the bonding layer in the first substrate by sputtering deposition.

<Formation of Chips>

The first substrate with the bonding layer and a copper electrode, and the second substrate on which the bonding layer was formed were each diced into 20 mm×20 mm square chips.

<Manufacturing of Temporarily Fixed Substrate Layered Body>

The surface of the bonding layer on the diced first substrate and the surface of the bonding layer on the diced second substrate were brought into contact with each other at room temperature (23° C.) under air, and a temporarily fixed substrate layered body composed of the first substrate, the bonding layer, and the second substrate was manufactured.

<Manufacturing of Substrate Layered Body>

The first substrate and the second substrate were bonded together by performing thermocompression on the temporarily fixed substrate layered body formed as described above at 250° C. for 5 minutes under 2 MPa in an air atmosphere, thereby obtaining a substrate layered body.

<Method 1 of Determining Presence or Absence of Void Between Substrates>

The presence or absence of voids between the substrates of the substrate layered body manufactured in Example 11 was observed with an infrared microscope. Specifically, the presence or absence of voids within 5 mm from the edge of a copper electrode was confirmed by observing an infrared transmitted light of the substrate layered body using a semiconductor internal observer C9597-42U30 (manufactured by Hamamatsu Photonics K.K.) and an infrared microscope MX63-IR (manufactured by Olympus Corporation).

In this method 1 of determination, no voids were observed in the substrate layered body obtained in Example 11 (below the measurement limit).

<Method 2 of Determining Presence or Absence of Void Between Substrates>

The substrate layered body obtained in Example 11 was cut, and a cross section of the substrate layered body was observed with a scanning electron microscope, and the presence or absence of voids between the substrates was determined.

No voids were observed in the cross section of the substrate layered body obtained in Example 11.

Comparative Example 4

<Preparation of Solution Containing Bonding Material>

After obtaining a mixed solution of ethanol (EtOH), water, and nitric acid containing a hydrolysate of tetraethoxysilane (TEOS) and a siloxane polymer in according to A2** Method in *THE JOURNAL OF PHYSICAL CHEMISTRY C*, 2011, No. 115, pp. 12981-12989, water, ethanol, and 1-propanol were added thereto in such a manner to attain TEOS (8.4% by mass), EtOH (12.9% by mass), 1-propanol (1PrOH) (75% by mass), and nitric acid ($HNO_3$) (0.075% by mass), to prepare a solution. Furthermore, an evaporator was used to concentrate the above-described solution until attaining TEOS (50% by mass), and a solution containing a bonding material was prepared. The concentrations in parentheses for 1PrOH, EtOH, and nitric acid represent the concentrations of 1PrOH, EtOH, and nitric acid in the solution before concentration, respectively, and are the same in each of the following Examples and Comparative Examples.

<Preparation of Substrates>

A first substrate and a second substrate were prepared in the same manner as in Example 5.

<Formation of Bonding Layer>

A bonding layer (degree of curing 95% or more, thickness of 550 nm, reduced modulus 33.4 GPa, water droplet contact angle 44°, surface roughness (Ra) 0.20 nm) with a siloxane bond and an imide bond was formed in the same manner as in Example 11.

It was confirmed that the amount of silicon on the surface of the bonding layer was 29.4 atomic percent and a silanol group was present (TOF-SIMS peak count of $2\times10^{-5}$).

<Formation of Copper Electrode>

A copper electrode was formed in the same manner as in Example 11.

<Formation of Chips>

In the same manner as in Example 11, the first substrate and the second substrate, which had undergone the above-described step, were each diced into 20 mm×20 mm square chips.

<Manufacturing of Temporarily Fixed Substrate Layered Body>

A temporarily fixed substrate layered body was manufactured in the same manner as in Example 11.

<Manufacturing of Substrate Layered Body>

Thermocompression was performed on the temporarily fixed substrate layered body formed as described above at 250° C. for 5 minutes under 2 MPa in an air atmosphere, but the first substrate and the second substrate were detached from the temporarily fixed substrate layered body, and the bonding was failed. It is assumed that the reason is that the unevenness of the bonding surfaces could not be absorbed and the first substrate and the second substrate could not be bonded.

Comparative Example 5

<Preparation of Solution Containing Bonding Material>

After obtaining a mixed solution of ethanol (EtOH), water, and nitric acid ($HNO_3$) containing a hydrolysate of bis(triethoxysilyl)ethane (BTESE) and a siloxane polymer in according to A2** Method in *THE JOURNAL OF PHYSICAL CHEMISTRY C*, 2011, No. 115, pp. 12981-12989, water, ethanol, and 1-propanol were added thereto in such a manner to attain BTESE (4.2% by mass), EtOH (6.8% by mass), 1PrOH (88.9% by mass), and nitric acid ($HNO_3$) (0.075% by mass), to prepare a solution. Furthermore, an evaporator was used to concentrate the above-described solution until attaining BTESE (24% by mass), and a solution containing a bonding material was prepared.

<Preparation of Substrates>

A first substrate and a second substrate were prepared in the same manner as in Example 5.

<Formation of Bonding Layer>

A bonding layer (degree of curing 95% or more, thickness of 450 nm, reduced modulus 15.9 GPa, water droplet contact angle 45°, surface roughness (Ra) 0.30 nm) with a siloxane bond and an imide bond was formed in the same manner as in Example 11.

It was confirmed that the amount of silicon on the surface of the bonding layer was 23.5 atomic percent and a silanol group was present (TOF-SIMS peak count of $6 \times 10^{-4}$).

<Formation of Copper Electrode>

A copper electrode was formed in the same manner as in Example 11.

<Formation of Chips>

In the same manner as in Example 11, the first substrate and the second substrate, which had undergone the above-described step, were each diced into 20 mm×20 mm square chips.

<Manufacturing of Temporarily Fixed Substrate Layered Body>

A temporarily fixed substrate layered body was manufactured in the same manner as in Example 11.

<Manufacturing of Substrate Layered Body>

Thermocompression was performed on the temporarily fixed substrate layered body formed as described above at 250° C. for 5 minutes under 2 MPa in an air atmosphere, but the first substrate and the second substrate were detached from the temporarily fixed substrate layered body, and the bonding was failed. It is assumed that the reason is that the unevenness of the bonding surfaces could not be absorbed and the first substrate and the second substrate could not be bonded.

Example 12

<Preparation of Solution Containing Bonding Material>

A solution containing a bonding material was prepared in the same manner as in Example 4.

<Preparation of Substrates>

A first substrate and a second substrate were prepared in the same manner as in Example 5.

<Formation of Bonding Layer>

A bonding layer (degree of curing 95% or more, thickness of 1.5 μm, reduced modulus 5.5 GPa) with a siloxane bond and an imide bond was formed in the same manner as in Example 11.

The amount of silicon on the surface of the bonding layer and the presence or absence of a silanol group were the same as in Example 4.

<Formation of Copper Electrode>

A copper electrode was formed in the same manner as in Example 11.

<Formation of Chips>

In the same manner as in Example 11, the first substrate and the second substrate, which had undergone the above-described step, were each diced into 20 mm×20 mm square chips.

<Manufacturing of Temporarily Fixed Substrate Layered Body>

A temporarily fixed substrate layered body was manufactured in the same manner as in Example 11.

<Manufacturing of Substrate Layered Body>

A substrate layered body was manufactured in the same manner as in Example 11.

<Method 1 of Determining Presence or Absence of Void Between Substrates>

The presence or absence of voids between the substrates of the substrate layered body manufactured in Example 12 was observed with an infrared microscope in the same manner as in Example 11. In this method 1 of determination, no voids were observed in the substrate layered body obtained in Example 12 (below the measurement limit).

<Method 2 of Determining Presence or Absence of Void Between Substrates>

The substrate layered body manufactured in Example 12 was cut, and a cross section of the substrate layered body was observed with a scanning electron microscope, and the presence or absence of voids between the substrates was determined.

No voids were observed in the cross section of the substrate layered body obtained in Example 12.

Example 13

<Preparation of Solution Containing Bonding Material>

A solution containing a bonding material was prepared in the same manner as in Example 12.

<Preparation of Substrates>

A first substrate and a second substrate were prepared in the same manner as in Example 7.

<Formation of Bonding Layer>

A bonding layer (degree of curing 95% or more, thickness of 1.5 μm, reduced modulus 5.5 GPa) with a siloxane bond and an imide bond was formed in the same manner as in Example 11.

The amount of silicon on the surface of the bonding layer and the presence or absence of a silanol group were the same as in Example 4.

<Formation of Copper Electrode>

A copper electrode was formed in the same manner as in Example 11.

<Formation of Chips>

In the same manner as in Example 11, the first substrate and the second substrate, which had undergone the above-described step, were each diced into 20 mm×20 mm square chips.

<Manufacturing of Temporarily Fixed Substrate Layered Body>

A temporarily fixed substrate layered body was manufactured in the same manner as in Example 11.

<Manufacturing of Substrate Layered Body>

A substrate layered body was manufactured in the same manner as in Example 11.

<Method 1 of Determining Presence or Absence of Void Between Substrates>

The presence or absence of voids between the substrates of the substrate layered body manufactured in Example 13 was observed with an infrared microscope in the same manner as in Example 11. In this method 1 of determination, no voids were observed in the substrate layered body obtained in Example 13 (below the measurement limit).

<Method 2 of Determining Presence or Absence of Void Between Substrates>

The substrate layered body manufactured in Example 13 was cut, and a cross section of the substrate layered body was observed with a scanning electron microscope, and the presence or absence of voids between the substrates was determined.

No voids were observed in the cross section of the substrate layered body obtained in Example 13.

Example 14

<Preparation of Solution Containing Bonding Material>

A solution containing a bonding material was prepared in the same manner as in Example 12.

<Preparation of Substrates>

A first substrate and a second substrate were prepared in the same manner as in Example 8.

<Formation of Bonding Layer>

A bonding layer (degree of curing 95% or more, thickness of 1.5 µm, reduced modulus 5.5 GPa) with a siloxane bond and an imide bond was formed in the same manner as in Example 11.

The amount of silicon on the surface of the bonding layer and the presence or absence of a silanol group were the same as in Example 4.

<Formation of Copper Electrode>

A copper electrode was formed in the same manner as in Example 11.

<Formation of Chips>

In the same manner as in Example 11, the first substrate and the second substrate, which had undergone the above-described step, were each diced into 20 mm×20 mm square chips.

<Manufacturing of Temporarily Fixed Substrate Layered Body>

A temporarily fixed substrate layered body was manufactured in the same manner as in Example 11.

<Manufacturing of Substrate Layered Body>

A substrate layered body was manufactured in the same manner as in Example 11.

<Method 1 of Determining Presence or Absence of Void Between Substrates>

The presence or absence of voids between the substrates of the substrate layered body manufactured in Example 14 was observed with an infrared microscope in the same manner as in Example 11. In this method 1 of determination, no voids were observed in the substrate layered body obtained in Example 14 (below the measurement limit).

<Method 2 of Determining Presence or Absence of Void Between Substrates>

The substrate layered body manufactured in Example 14 was cut, and a cross section of the substrate layered body was observed with a scanning electron microscope, and the presence or absence of voids between the substrates was determined.

No voids were observed in the cross section of the substrate layered body obtained in Example 14.

Example 15

<Preparation of Solution Containing Bonding Material>

A solution containing a bonding material was prepared in the same manner as in Example 4.

<Preparation of Substrates>

A first substrate and a second substrate were prepared in the same manner as in Example 5.

<Formation of Bonding Layer>

A bonding layer (degree of curing 95% or more, thickness of 2.8 µm, reduced modulus 5.5 GPa) with a siloxane bond and an imide bond was formed in the same manner as in Example 11.

The amount of silicon on the surface of the bonding layer and the presence or absence of a silanol group were the same as in Example 4.

<Manufacturing of Temporary Fixed Substrate Layered Body>

A temporarily fixed substrate layered body was manufactured in the same manner as in Example 5. The surface energy of the bonding interface of the above-described temporarily fixed substrate layered body was 0.1 J/m$^2$.

<Manufacturing of Substrate Layered Body>

The first substrate and the second substrate were bonded by heating the temporarily fixed substrate layered body formed as described above at 200° C. for 30 minutes, in a nitrogen atmosphere to obtain a substrate layered body. In the obtained substrate layered body, the surface energy of the bonding interface between the first substrate and the second substrate was 2.5 J/m$^2$ or more (measurement limit).

Example 16

<Preparation of Solution Containing Bonding Material>

A solution containing a bonding material was prepared in the same manner as in Example 4, except that a hydrolysate of 0.42 g of (3-aminopropyl) diethoxymethylsilane (3AP-DES) and 0.44 g of 4,4'-oxydiphthalic acid half ester (R in Formula (B-1) was an ethyl group) were used.

<Preparation of Substrates>

A first substrate and a second substrate were prepared in the same manner as in Example 5.

<Formation of Bonding Layer>

A bonding layer (degree of curing 95% or more, thickness 140 nm, reduced modulus 5.8 GPa) with a siloxane bond and an imide bond was formed in the same manner as in Example 10.

The amount of silicon on the surface of the bonding layer and the presence or absence of a silanol group were the same as in Example 4.

<Manufacturing of Temporarily Fixed Substrate Layered Body>

A temporarily fixed substrate layered body was manufactured in the same manner as in Example 5. The surface energy of the bonding interface of the above-described temporarily fixed substrate layered body was 0.2 J/m$^2$.

<Manufacturing of Substrate Layered Body>

A substrate layered body was obtained in the same manner as in Example 15. The surface energy of the bonding interface between the first substrate and the second substrate was 2.5 J/m$^2$ or more (measurement limit).

Example 17

<Preparation of Solution Containing Bonding Material>

A solution containing a bonding material was prepared in the same manner as in Example 16.

<Preparation of Substrates>

A first substrate and a second substrate were prepared in the same manner as in Example 5.

<Formation of Bonding Layer>

A bonding layer (degree of curing 95% or more, thickness of 140 nm, reduced modulus 5.5 GPa, surface roughness (Ra) 0.30 nm, water droplet contact angle 73°) with a siloxane bond and an imide bond was formed in the same manner as in Example 5.

The amount of silicon on the surface of the bonding layer and the presence or absence of a silanol group were the same as in Example 4.

<Manufacturing of Temporary Fixed Substrate Layered Body>

A temporarily fixed substrate layered body was manufactured in the same manner as in Example 5. The surface energy of the bonding interface of the above-described temporarily fixed substrate layered body was 0.2 J/m$^2$.

<Manufacturing of Substrate Layered Body>

A substrate layered body was obtained in the same manner as in Example 15. The surface energy of the bonding interface between the first substrate and the second substrate was 2.5 J/m$^2$ or more (measurement limit).

Example 18

<Preparation of Solution Containing Bonding Material>

A solution containing a bonding material was prepared in the same manner as in Example 16.

<Preparation of Substrates>

A first substrate and a second substrate were prepared in the same manner as in Example 7.

<Formation of Bonding Layer>

A bonding layer (degree of curing 95% or more, thickness of 140 nm, reduced modulus 5.5 GPa, surface roughness (Ra) 0.30 nm, water droplet contact angle 73°) with a siloxane bond and an imide bond was formed in the same manner as in Example 5.

The amount of silicon on the surface of the bonding layer and the presence or absence of a silanol group were the same as in Example 4.

<Manufacturing of Temporary Fixed Substrate Layered Body>

A temporarily fixed substrate layered body was manufactured in the same manner as in Example 5. The surface energy of the bonding interface of the above-described temporarily fixed substrate layered body was 2.5 J/m$^2$ or more (measurement limit).

<Manufacturing of Substrate Layered Body>

A substrate layered body was obtained in the same manner as in Example 15. The surface energy of the bonding interface between the first substrate and the second substrate was 2.5 J/m$^2$ or more (measurement limit).

Example 19

<Preparation of Solution Containing Bonding Material>

A solution containing a bonding material was prepared in the same manner as in Example 16.

<Preparation of Substrates>

A first substrate and a second substrate were prepared in the same manner as in Example 8.

<Formation of Bonding Layer>

A bonding layer (degree of curing 95% or more, thickness of 140 nm, reduced modulus 5.5 GPa, surface roughness (Ra) 0.30 nm, water droplet contact angle 73°) with a siloxane bond and an imide bond was formed in the same manner as in Example 5.

The amount of silicon on the surface of the bonding layer and the presence or absence of a silanol group were the same as in Example 4.

<Manufacturing of Temporary Fixed Substrate Layered Body>

A temporarily fixed substrate layered body was manufactured in the same manner as in Example 5. The surface energy of the bonding interface of the above-described temporarily fixed substrate layered body was 0.9 J/m$^2$.

<Manufacturing of Substrate Layered Body>

A substrate layered body was obtained in the same manner as in Example 15. The surface energy of the bonding interface between the first substrate and the second substrate was 2.5 J/m$^2$ or more (measurement limit).

The disclosure of Japanese Patent Application 2018-202212, filed on Oct. 26, 2018 and the disclosure of Japanese Patent Application 2019-101252, filed on May 30, 2019 are incorporated herein by reference in its entirety.

All publications, patent applications, and technical standards mentioned in the present specification are incorporated herein by reference to the same extent as if each individual publication, patent application, or technical standard was specifically and individually indicated to be incorporated by reference.

The invention claimed is:

1. A method of manufacturing a substrate layered body, the method comprising:
   applying a bonding material to a surface of at least one of a first substrate or a second substrate, wherein the bonding material includes a polymerizable compound;
   curing the bonding material applied to the surface, to form a bonding layer having a reduced modulus at 23° C. of 10 GPa or less; and
   bonding the first substrate with the second substrate via the bonding layer.

2. The method of manufacturing a substrate layered body according to claim 1, wherein, in forming the bonding layer, the bonding material applied to the surface is heated at from 100° C. to 450° C. for curing.

3. The method of manufacturing a substrate layered body according to claim 1, wherein, in bonding the first substrate with the second substrate, the first substrate and the second substrate are bonded by heating the bonding layer at from 100° C. to 450° C., in a state in which the first substrate and the second substrate are in contact with each other via the bonding layer.

4. The method of manufacturing a substrate layered body according to claim 1, wherein a degree of curing of the bonding layer after forming the bonding layer and before bonding the first substrate with the second substrate is 70% or more.

5. The method of manufacturing a substrate layered body according to claim 1, wherein the bonding layer includes a silanol group on a surface thereof.

6. The method of manufacturing a substrate layered body according to claim 1, the method further comprising forming a hydroxyl group by performing a surface treatment on a surface of at least one of the first substrate or the second substrate at a side at which the substrate is in contact with the bonding layer.

7. The method of manufacturing a substrate layered body according to claim 1, wherein a thickness of the bonding layer in the substrate layered body is from 0.001 µm to 8.0 µm.

8. The method of manufacturing a substrate layered body according to claim 1, wherein, in the substrate layered body, a surface energy of a bonding interface between the first substrate and the second substrate is 2 $J/m^2$ or more.

9. The method of manufacturing a substrate layered body according to claim 1, the method further comprising temporarily fixing the first substrate and the second substrate via the bonding layer after forming the bonding layer, wherein the surface energy of the bonding interface between the first substrate and the second substrate after temporary fixing is 0.05 $J/m^2$ or more.

10. The method of manufacturing a substrate layered body according to claim 1, the method further comprising forming an electrode on the surface of the at least one of the first substrate or the second substrate to which the bonding material is applied, before applying the bonding material.

11. A method of manufacturing a substrate layered body, the method comprising:
 applying a bonding material to a surface of at least one of a first substrate or a second substrate;
 curing the bonding material applied to the surface, to form a bonding layer having a reduced modulus at 23° C. of 10 GPa or less, wherein the bonding layer includes a siloxane bond, and at least one of an amide bond or an imide bond; and
 bonding the first substrate with the second substrate via the bonding layer.

12. A method of manufacturing a substrate layered body, the method comprising:
 forming an electrode on a surface of at least one of a first substrate or a second substrate;
 applying a bonding material to the surface after forming the electrode;
 removing the bonding material from the electrode after applying the bonding material;
 curing the bonding material applied to the surface after removing the bonding material from the electrode, to form a bonding layer having a reduced modulus at 23° C. of 10 GPa or less; and
 bonding the first substrate with the second substrate via the bonding layer.

13. A method of manufacturing a substrate layered body, the method comprising:
 forming an electrode on a surface of at least one of a first substrate or a second substrate;
 applying a bonding material to the surface after forming the electrode;
 curing the bonding material applied to the surface, to form a bonding layer having a reduced modulus at 23° C. of 10 GPa or less;
 removing the bonding layer from the electrode after forming the bonding layer; and
 bonding the first substrate with the second substrate via the bonding layer after removing the bonding layer from the electrode.

14. A method of manufacturing a substrate layered body, the method comprising:
 applying a bonding material to a surface of at least one of a first substrate or a second substrate;
 curing the bonding material applied to the surface, to form a bonding layer having a reduced modulus at 23° C. of 10 GPa or less;
 forming an electrode on the surface on which the bonding layer has been formed after forming the bonding layer; and
 bonding the first substrate with the second substrate via the bonding layer after forming the electrode.

\* \* \* \* \*